United States Patent
Hwang et al.

(10) Patent No.: US 9,070,587 B2
(45) Date of Patent: Jun. 30, 2015

(54) VERTICAL STRUCTURE NON-VOLATILE MEMORY DEVICE HAVING INSULATING REGIONS THAT ARE FORMED AS AIR GAPS BETWEEN SELECTION TRANSISTORS OF ADJACENT MEMORY CELL STRINGS

(75) Inventors: Sung-min Hwang, Seoul (KR); Han-soo Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 67 days.

(21) Appl. No.: 13/190,932

(22) Filed: Jul. 26, 2011

(65) Prior Publication Data
US 2012/0032245 A1 Feb. 9, 2012

(30) Foreign Application Priority Data
Aug. 3, 2010 (KR) .................. 10-2010-0074984

(51) Int. Cl.
*H01L 29/788* (2006.01)
*H01L 27/115* (2006.01)
*H01L 29/792* (2006.01)

(52) U.S. Cl.
CPC .... *H01L 27/11556* (2013.01); *H01L 27/11551* (2013.01); *H01L 27/11578* (2013.01); *H01L 29/7889* (2013.01); *H01L 29/7926* (2013.01)

(58) Field of Classification Search
CPC .................. H01L 27/11551; H01L 27/11556; H01L 27/11578; H01L 29/7889; H01L 29/7926
USPC .................... 257/2–5, 314, E29.255
See application file for complete search history.

(56) References Cited

U.S. PATENT DOCUMENTS

| | | | |
|---|---|---|---|
| 2007/0096202 A1* | 5/2007 | Kang et al. ..................... | 257/324 |
| 2007/0184615 A1* | 8/2007 | Brazzelli et al. .............. | 438/266 |
| 2008/0253187 A1* | 10/2008 | Aritome .................... | 365/185.17 |
| 2009/0212352 A1* | 8/2009 | Aoyama et al. ................ | 257/324 |
| 2009/0302367 A1* | 12/2009 | Nagano ......................... | 257/316 |
| 2009/0310425 A1* | 12/2009 | Sim et al. ................. | 365/185.29 |
| 2010/0078701 A1* | 4/2010 | Shim et al. .................... | 257/314 |
| 2010/0090286 A1* | 4/2010 | Lee et al. ...................... | 257/368 |
| 2010/0097859 A1* | 4/2010 | Shim et al. ............... | 365/185.05 |
| 2010/0163968 A1* | 7/2010 | Kim et al. ..................... | 257/324 |

* cited by examiner

*Primary Examiner* — William F Kraig
*Assistant Examiner* — Khaja Ahmad
(74) *Attorney, Agent, or Firm* — Myers Bigel Sibley & Sajovec, PA

(57) ABSTRACT

A vertical structure non-volatile memory device includes semiconductor regions that vertically extend on a substrate, a plurality of memory cell strings that vertically extend on the substrate along sidewalls of the semiconductor regions and include a plurality of memory cells and at least one or more first selection transistors, which are disposed on sides of the memory cells and are adjacent to one another. A plurality of wordlines is connected to the memory cells of the memory cell strings. A first selection line is connected to the selection transistors of the memory cell strings and insulating regions are formed as air gaps between the first selection transistors of the adjacent memory cell strings.

17 Claims, 21 Drawing Sheets

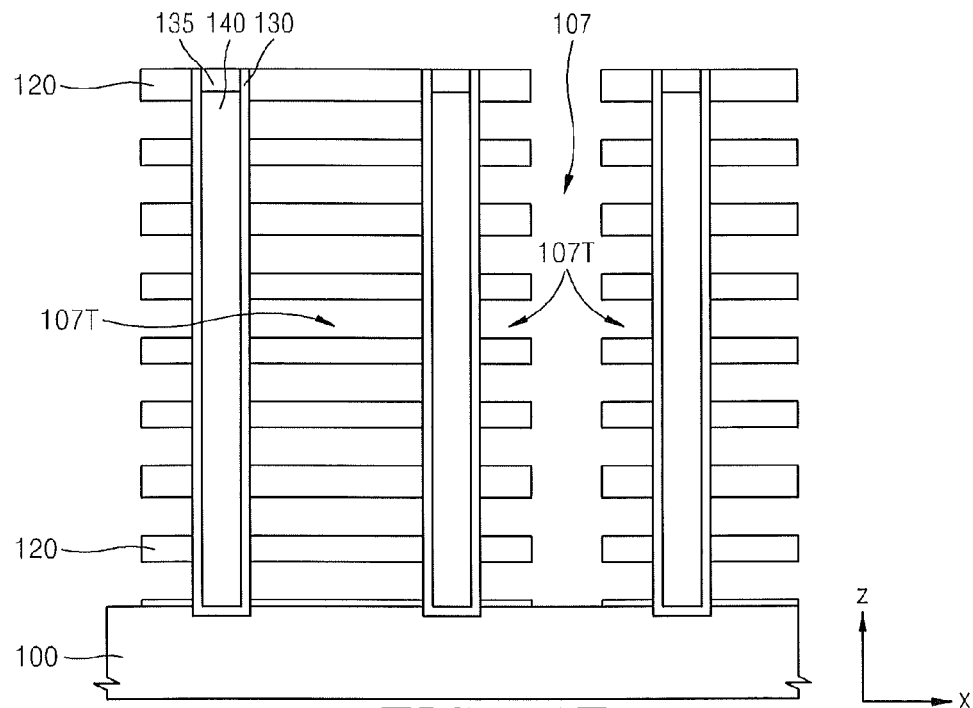
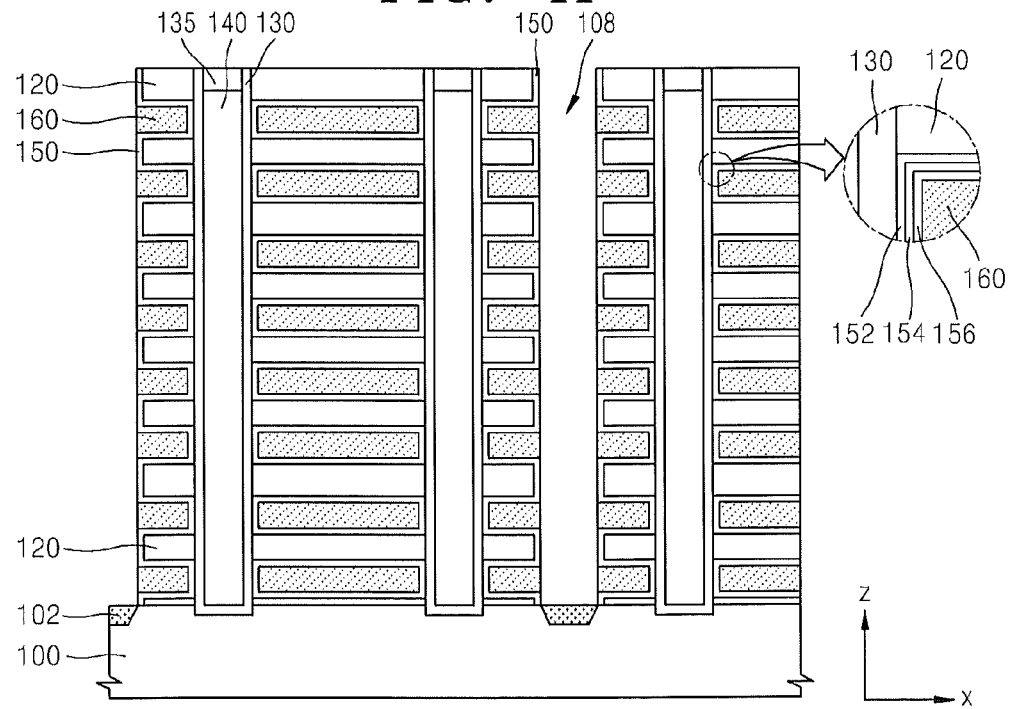

VERTICAL STRUCTURE NON-VOLATILE MEMORY DEVICE HAVING INSULATING REGIONS THAT ARE FORMED AS AIR GAPS BETWEEN SELECTION TRANSISTORS OF ADJACENT MEMORY CELL STRINGS

CROSS-REFERENCE TO RELATED APPLICATIONS

This application claims the benefit of Korean Patent Application No. 10-2010-0074984, filed on Aug. 3, 2010, in the Korean Intellectual Property Office, the disclosure of which is incorporated herein in its entirety by reference.

BACKGROUND

The inventive concept relates to a vertical structure non-volatile memory device, and more particularly, to a non-volatile memory device having a vertical channel structure for an increase in integration.

Electronic products generally need to be gradually reduced in volume and to process a large capacity of data. Thus, the integration density of semiconductor memory devices used in such electronic products may be increased. A non-volatile memory device having a vertical transistor structure instead of an existing planar transistor structure has been suggested as one of methods of improving the integration of semiconductor memory devices.

SUMMARY

The inventive concept provides a vertical structure non-volatile memory device having reliability improved by an enhanced signal transmission capability.

According to an aspect of the inventive concept, there is provided a vertical structure non-volatile memory device including: semiconductor regions that vertically extend on a substrate; a plurality of memory cell strings that vertically extend on the substrate along sidewalls of the semiconductor regions, include a plurality of memory cells and at least one or more first selection transistors that are disposed on sides of the memory cells, and are adjacent to one another; a plurality of wordlines that are connected to the memory cells of the memory cell strings; a first selection line that is connected to the first selection transistors of the memory cell strings; and insulating regions that are formed as air gaps between the first selection transistors of the adjacent memory cell strings.

Gate electrodes of the adjacent memory cells of the adjacent memory cell strings may be connected to one another.

Insulating layers are disposed below the insulating regions.

The insulating regions may extend in a vertical direction to the substrate and thus may contact the substrate.

The insulating regions may be disposed one-by-one for every two of the memory cell strings in orthogonal direction to an extension direction of the wordlines and may extend toward the wordlines.

The vertical structure non-volatile memory device may further include: bitlines that are connected to ends of the memory cell strings; and common source lines that are connected to other ends of the memory cell strings in an opposite direction to the bitlines.

The common source lines may be vertically disposed on the substrate between the adjacent memory cell strings.

Upper ends of the common source lines may be lower than lower ends of the first selection transistors.

A pair of first selection transistors may be connected to each other in series and disposed between the bitlines and the memory cells.

The vertical structure non-volatile memory device may further include connection electrodes that electrically connect the pair of first selection transistors to each other and extend along the first selection line.

The memory cell strings may further include at least one or more second selection transistors that are disposed at ends of the memory cells and opposite to the first selection transistors.

The insulating regions are also disposed between the second selection transistors of the adjacent memory cell strings.

The memory cells and the first selection transistors may include gate dielectric layers and gate electrodes that are formed on sidewalls of the semiconductor regions.

The gate dielectric layers may include tunneling insulating layers, charge storage layers, and block insulating layers that are sequentially stacked from the semiconductor regions.

According to another aspect of the inventive concept, there is provided a vertical structure non-volatile memory device including: semiconductor regions that vertically extend on a substrate; memory cell strings that vertically extend on the substrate along sidewalls of the semiconductor regions and include a plurality of memory cells and at least one pair of first selection transistors that are adjacent to each other beside the memory cells; a plurality of wordlines that are connected to the memory cells of the memory cell strings; and a first selection line that is commonly connected to gate electrodes of the first selection transistors of the memory cell strings through connection electrodes that are connected to the gate electrodes of the first selection transistors.

The first selection line may be wired to a peripheral circuit through one contact plug.

Upper ends of the connection electrodes protrude higher than upper ends of the first selection transistors.

The memory cell strings may further include at least one or more second selection transistors that are disposed at other sides of the memory cells and opposite to the first selection transistors.

The vertical structure non-volatile memory device may further include a second selection line that is commonly connected to gate electrodes of the second selection transistors of the memory cell strings through connection electrodes that are connected to the gate electrodes of the second selection transistors.

According to another aspect of the inventive concept, there is provided a vertical structure non-volatile memory device including: semiconductor regions that vertically extend on a substrate; a plurality of memory cell strings that include a plurality of transistors vertically arrayed on the substrate along sidewalls of the semiconductor regions and are adjacent to one another; and insulating regions that are formed as air gaps between the transistors of the adjacent memory cell strings.

BRIEF DESCRIPTION OF THE DRAWINGS

Exemplary embodiments of the inventive concept will be more clearly understood from the following detailed description taken in conjunction with the accompanying drawings in which:

FIGS. 4A through 4J are cross-sectional views illustrating a method of fabricating the non-volatile memory device of FIG. 3, according to an embodiment of the inventive concept;

DETAILED DESCRIPTION OF THE EMBODIMENTS

Figure 1:
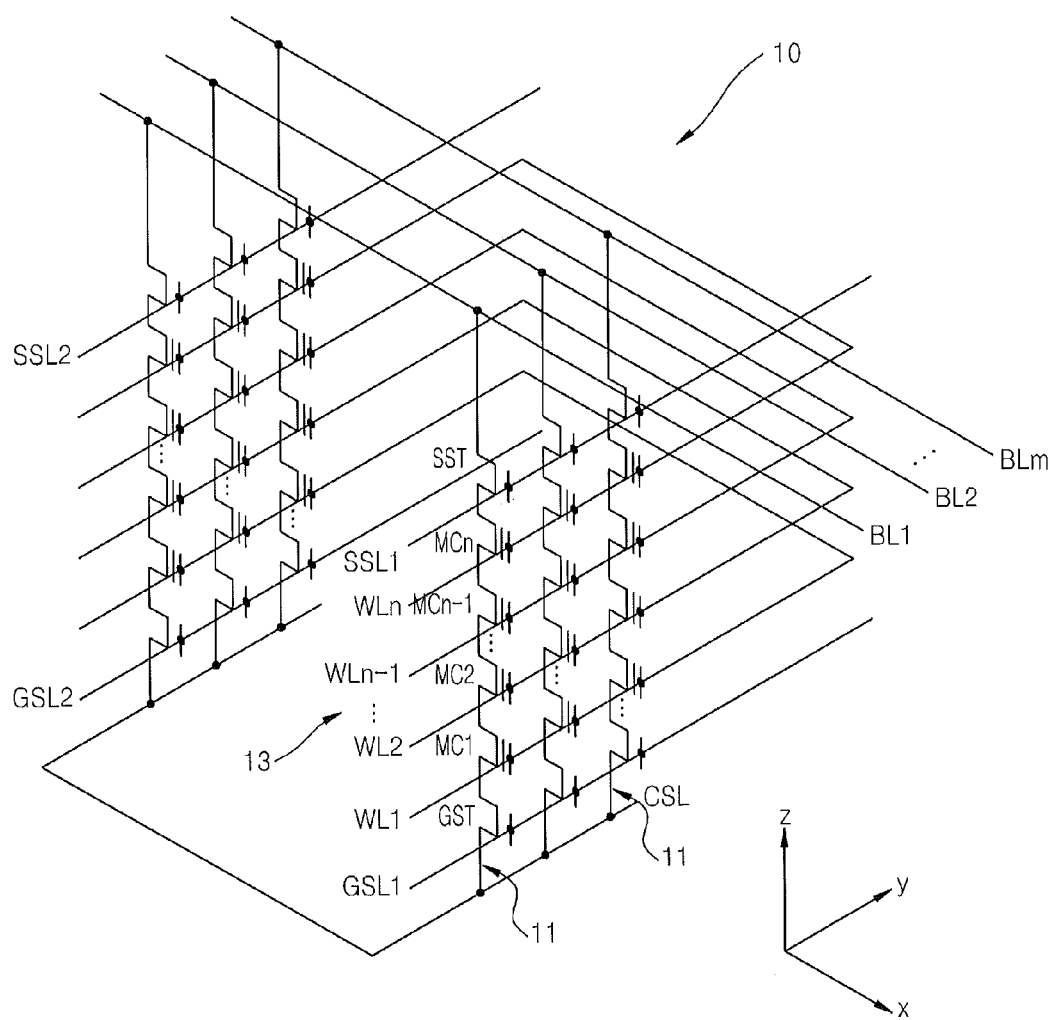
FIG. 1 is an equivalent circuit diagram of a memory cell array of a non-volatile memory device according to an embodiment of the inventive concept.

The inventive concept will now be described more fully with reference to the accompanying drawings, in which exemplary embodiments of the inventive concept are shown. The inventive concept may, however, be embodied in many different forms and should not be construed as being limited to the embodiments set forth herein; rather, these embodiments are provided so that this disclosure will be thorough and complete, and will fully convey the inventive concept.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. In the drawings, the thicknesses of layers and regions are exaggerated for clarity. Like reference numerals refer to like elements throughout the description. As used herein, the term "and/or" includes any and all combinations of one or more of the associated listed items.

The terminology used herein is for describing particular embodiments and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, third etc. may be used herein to describe various elements, components, regions, layers and/or sections, these elements, components, regions, layers and/or sections should not be limited by these terms. These terms are used to distinguish one element, component, region, layer or section from another region, layer or section. Thus, a first element, component, region, layer or section discussed below could be termed a second element, component, region, layer or section without departing from the teachings of exemplary embodiments.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing.

A 3-dimensional (3-D) semiconductor device according to embodiments of the inventive concept may include a cell array region, a peripheral circuit region, a sense amplifier region, a decoding circuit region, and connection regions. A plurality of memory cells and bitlines and wordlines for electrical connections to the memory cells are disposed in the cell array region. Circuits for driving the memory cells are disposed in the peripheral circuit region, and circuits for reading information from the memory cells are disposed in the sense amplifier region. The connection regions may be disposed between the cell array region and the decoding circuit region. Here, wiring structures for electrically connecting the wordlines to the decoding circuit region may be disposed as the connection regions between the cell array region and the decoding circuit region.

FIG. 1 is an equivalent circuit diagram of a memory cell array 10 of a non-volatile memory device according to an embodiment of the inventive concept. In other words, FIG. 1 exemplifies an equivalent circuit diagram of a vertical structure NAND flash memory device having a vertical channel structure.

Referring to FIG. 1, the memory cell array 10 includes a plurality of memory cell strings 11. Each of the memory cell strings 11 has a vertical structure, which extends in a vertical direction (i.e., z-direction) with respect to extension directions (i.e., x-direction and y-direction) of a main surface of a substrate (not shown). The memory cell strings 11 constitute a memory cell block 13.

Each of the memory cell strings 11 includes a plurality of memory cells MC1 through MCn, a string selection transistor SST, and a ground selection transistor GST. In each of the memory cell strings 11, the ground selection transistor GST, the memory cells MC1 through MCn, and the string selection transistor SST are vertically (i.e., in the z-direction) disposed in series. Here, the memory cells MC1 through MCn store data. A plurality of wordlines WL1 through WLn are respectively connected to and control the memory cells MC1 through MCn. The number of memory cells MC1 through MCn may be appropriately selected according to a capacity of a semiconductor memory device.

A plurality of bitlines BL1 through BLm extend in the x-direction and are connected to ends of the memory cells strings 11, which are arrayed in first through $m^{th}$ columns of the memory cell block 13, e.g., to drains of the string selection transistors SST. A common source line CSL is connected to other ends of the memory cell strings 11, e.g., to sources of the ground selection transistors GST.

The wordlines WL1 through WLn, which extend in the y-direction, are commonly connected to gates of the memory cells MC1 through MCn of the memory cell strings 11 which are arrayed on the same layer. Data is programmed in, read from, or erased from the memory cells MC1 through MCn according to driving states of the word lines WL1 through WLn.

The string selection transistors SST of the memory cell strings 11 are arrayed between the bitlines BL1 through BLm and the memory cells MC1 and MCn. In the memory cell block 13, the string selection transistors SST control data transmissions, which are performed between the bitlines BL1 through BLm and the memory cells MC1 through MCn, through string selection lines SSL which are connected to gates of the string selection transistors SST.

The ground selection transistors GST are arrayed between the memory cells MC1 through MCn and the common source line CSL. In the memory cell block 13, the ground selection transistors GST control data transmissions, which are performed between the memory cells MC1 through MCn and the common source line CSL, through a ground selection line GSL, which is connected to gates of the ground selection transistors GST.

Figure 2:
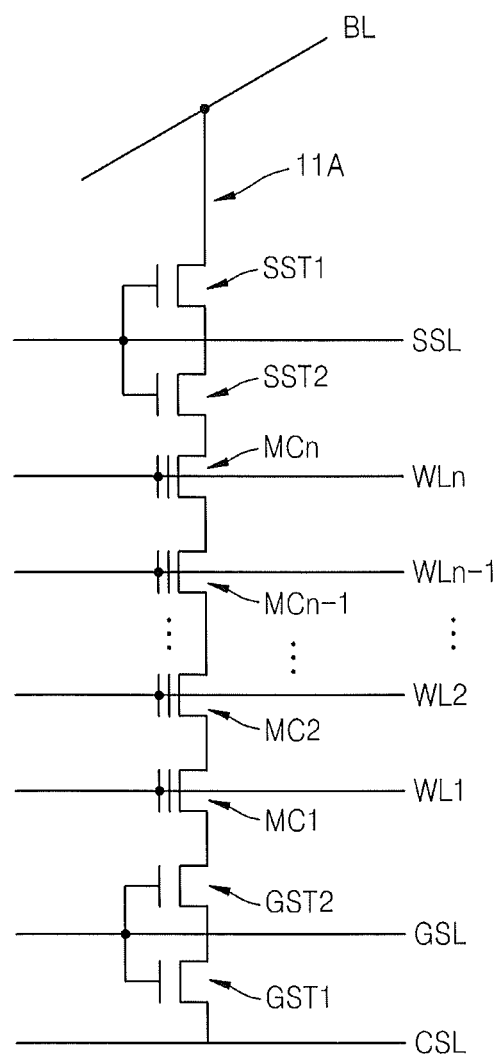
FIG. 2 is an equivalent circuit diagram of a memory cell string of a non-volatile memory device according to another embodiment of the inventive concept.

FIG. 2 is an equivalent circuit diagram of a memory cell string 11A of a non-volatile memory device according to another embodiment of the inventive concept. In other words, FIG. 2 exemplifies an equivalent circuit diagram of the memory cell string 11A of a vertical structure NAND flash memory device having a vertical channel structure.

The same reference numerals of FIG. 2 as those of FIG. 1 denote the same elements, and thus their detailed descriptions will be omitted herein.

In FIG. 1, each of the string selection transistors SST is constituted as a single transistor. However, in the current embodiment of FIG. 2, instead of the string selection transistors SST of FIG. 1, a pair of first and second string selection transistors SST1 and SST2 are arrayed in series between a bitline BL and a plurality of memory cells MC1 through MCn. In this case, a string selection line SSL is commonly connected to gates of the first and second string selection transistors SST1 and SST2. Here, the string selection line SSL may correspond to a first string selection line SSL1 or a second string selection line SSL2 of FIG. 1.

In FIG. 1, each of the ground selection transistors GST is constituted as a single transistor. However, in the current embodiment of FIG. 2, instead of the ground selection transistors GST, a pair of first and second ground selection transistors GST1 and GST2 are arrayed in series between the memory cells MC1 through MCn and a common source line CSL. In this case, a ground selection line GSL is commonly connected to gates of the first and second ground selection transistors GST1 and GST2. The ground selection line GSL may correspond to a first ground selection line GSL1 or a second ground selection line GSL2 of FIG. 1.

The bitline BL may correspond to one of the bitlines BL1 through BLm of FIG. 1.

Figure 3:
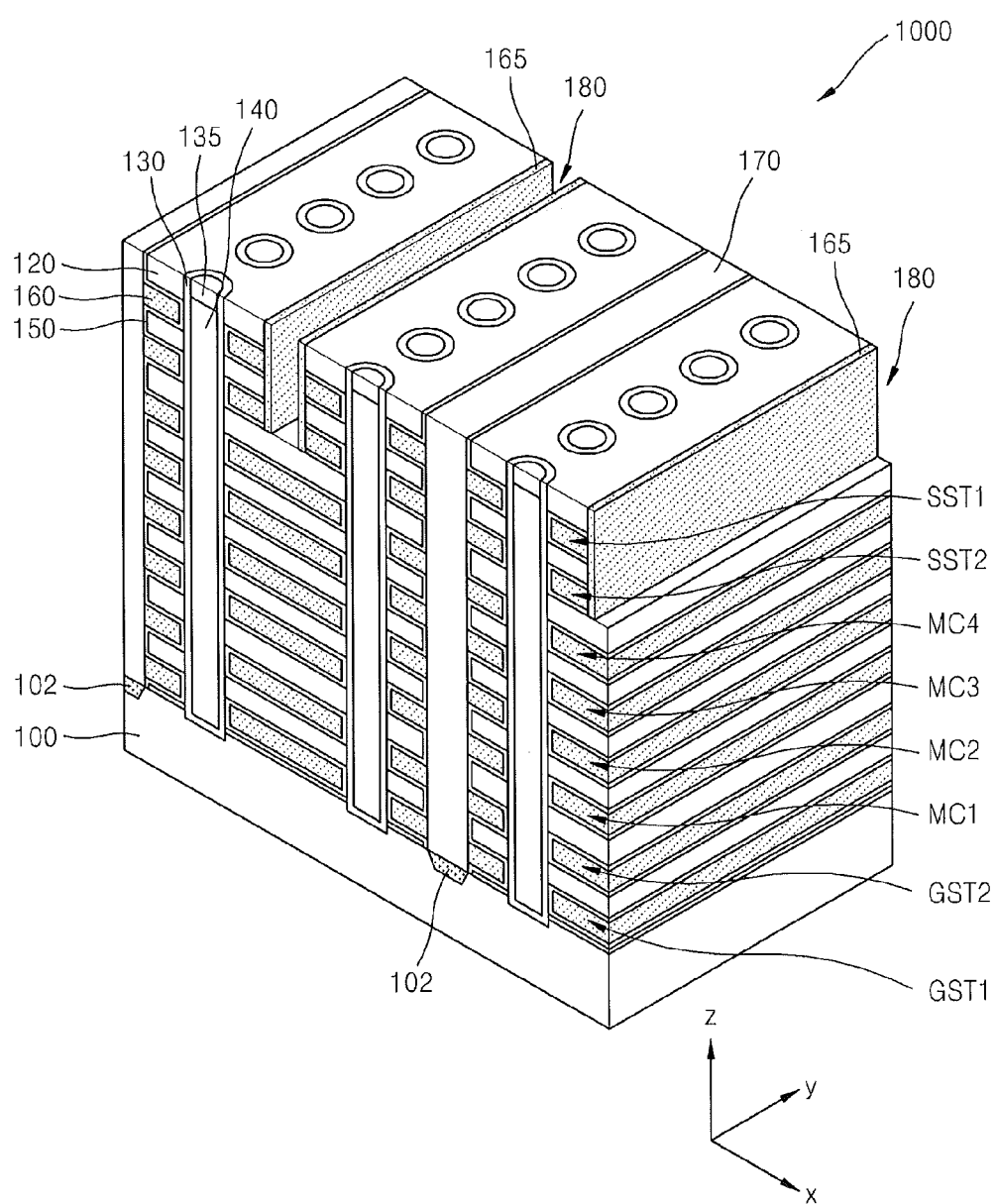
FIG. 3 is a schematic perspective view of a 3-dimensional (3-D) structure of memory cell strings of a non-volatile memory device according to an embodiment of the inventive concept.

FIG. 3 is a schematic perspective view of a 3-D structure of memory cell strings of a non-volatile memory device 1000 according to an embodiment of the inventive concept.

Some elements constituting the memory cell strings of FIG. 3 may be omitted from elements of the memory cell strings of FIG. 1. For example, bitlines BL of the memory cell strings are omitted in FIG. 3.

Referring to FIG. 3, the non-volatile memory device 1000 includes a substrate 100 having a main surface, which extends in an x-direction and a y-direction. The substrate 100 may include a semiconductor material, e.g., a group IV semiconductor, a group III-V compound semiconductor, or a group II-VI oxide semiconductor. For example, the group IV semiconductor may include silicon, germanium, or silicon-germanium. The substrate 100 may be a bulk wafer or an epitaxial layer.

Semiconductor regions 130 are disposed in pillar shapes extending in a z-direction on the substrate 100. The semiconductor regions 130 are spaced apart from one another in the x-direction and y-direction. The semiconductor regions 130 may be formed in ring shapes. Lower surfaces of the semiconductor regions 130 directly contact the substrate 100. The semiconductor regions 130 may include undoped polysilicon or undoped single crystal silicon.

The semiconductor regions 130 include insulating pillars 140 therein. The insulating pillars 140 may include updoped silica glass (USG), spin-on glass (SOG), tonen silazene (TOSZ). According to an aspect of the inventive concept, the semiconductor regions 130 may include semiconductor pillars, which are filled with a semiconductor material, instead of including the insulating pillars 140 which extend in the z-direction.

Conductive layers 135 cover upper surfaces of the insulating pillars 140 and are electrically connected to the semiconductor regions 130. The conductive layers 135 may include doped polysilicon. The conductive layers 130 may operate as drain regions of a string selection transistor SST1 and SST2.

Impurity regions 102 extend in the y-direction adjacent to the main surface of the substrate 100 and are spaced apart from one another in the x-direction. The impurity regions 102 may be arrayed one-by-one for every two of the semiconductor regions 130 in the x-direction. The impurity regions 102 may be source regions and may form P-N junctions with other regions of the substrate 100. The common source lines CSL of FIGS. 1 and 2 may be connected to the impurity regions 102 in not-shown regions. The impurity regions 102 may include heavily-doped impurity regions (not shown), which are adjacent to the main surface of the substrate 100 and positioned in a center of the impurity regions 102 and lightly-doped impurity regions (not shown), which are disposed at both ends of each of the heavily-doped impurity regions. Insulating layers 170 are formed on the impurity regions 102.

A plurality of memory cell strings may be arrayed in the y-direction surrounding each of the semiconductor regions 130, which are arrayed in the y-direction. As shown in FIG. 3, memory cell strings (refer to 11 of FIG. 1 or 11A of FIG. 2) may be arrayed and extend from the substrate 100 in the z-direction along sides of the semiconductor regions 130. Each of the memory cell strings (11 or 11A) may include first and second ground selection transistors GST1 and GST2, a plurality of memory cells MC1, MC2, MC3, and MC4, first and second string selection transistors SST1 and SST2.

The first string selection transistors SST1 arrayed in the x-direction may be commonly connected to a bitline (not shown and refer to FIG. 2) through the conductive layers 135. The bitline may be formed in a line-shaped pattern, which extends in the x-direction and may be connected to the first string section transistors SST1 through contact electrodes (not shown), which are formed on the conductive layer 135. The first ground selection transistors GST1 arrayed in the x-direction may be electrically connected to the impurity regions 102, which are respectively adjacent to the first ground selection transistors GST1.

Four memory cells MC1, MC2, MC3, and MC4 are shown in FIG. 3 but are not limited thereto. Thus, a larger or smaller number of memory cells may be arrayed according to the capacity of the non-volatile memory device 1000. The pair of first and second string selection transistors SST1 and SST2 and the pair of first and second ground selection transistors GST1 and GST2 are arrayed in each of the memory cell strings. The inventive concept is not limited thereto; however, a string selection transistor SST and a ground selection transistor GST may be arrayed as in each of the memory cell strings of FIG. 1. The string selection transistor SST and the ground selection transistor GST may have different structures from the memory cells MC1, MC2, MC3, and MC4.

Gate electrodes 160 are arrayed along sides of the semiconductor regions 130 positioned in the x-direction and spaced apart from one another from the substrate 100 in the z-direction. The gate electrodes 160 may be gates of the first and second ground selection transistors GST1 and GST2, the memory cells MC1, MC2, MC3, and MC4, and the first and second string selection transistors SST1 and SST2. The gate electrodes 160 may be commonly connected to adjacent memory cell strings arrayed in the y-direction. The gate electrodes 160 of the first and second string selection transistors SST1 and SST2 may be connected to a string selection line (refer to the string selection line SSL of FIG. 1). The gate electrodes 160 of the memory cells MC1, MC2, MC3, and MC4 may be connected to wordlines, respectively (refer to the wordlines WL1 through WLn of FIG. 1). The gate electrodes 160 of the first and second ground selection transistors GST1 and GST2 may be connected to a ground selection line (refer to the ground selection line GSL of FIG. 1). The gate electrodes 160 may include metal layers, e.g, tungsten (W). Although not shown in FIG. 3, the gate electrodes 160 may further include diffusion barriers. For example, the diffusion barriers (not shown) may include one selected from tungsten nitride (WN), tantalum nitride (TaN), and titanium nitride (TiN).

The gate electrodes 160 of the pair of first and second string selection transistors SST1 and SST2 may be connected to one another through connection electrodes 165. The connection electrodes 165 may include the same material as that included in the gate electrodes 160. For example, the connection electrodes 165 may include W, WN, and/or TiN. According to another aspect of the inventive concept, the non-volatile memory device 1000 may not include the connection electrodes 165. In an embodiment of the inventive concept including a string selection transistor, a non-volatile memory device may not include the connection electrodes 165.

Interlayer insulating layers 120 are arrayed among the gate electrodes 160. Like the gate electrodes 160, the interlayer insulating layers 120 are spaced apart from one another in the z-direction and extend in the y-direction. Sides of the interlayer insulating layers 120 contact the semiconductor regions 130. The interlayer insulating layers 120 may include silicon oxide or silicon nitride.

Gate dielectric layers 150 are disposed between the semiconductor regions 130 and the gate electrodes 160. The gate dielectric layers 150 cover upper and lower surfaces of the gate electrodes 160. The gate dielectric layers 150 cover other sides of the interlayer insulating layers 120 which do not contact the semiconductor regions 130.

Although not shown in FIG. 3, the gate dielectric layers 150 may include tunneling insulating layers, charge storage layers, and blocking insulating layers, which are sequentially stacked from the semiconductor regions 130.

The tunneling insulating layers tunnel charges to the charge storage layers using an F-N method. For example, the tunneling insulating layers may include silicon oxide. The charge storage layers may be charge trap layers or floating gate conductive layers. For example, the charge trap layers may include quantum dots or nanocrystals. Here, the quantum dots or the nanocrystals may be formed of fine particles of a conductor, e.g., fine particles of a metal or a semiconductor. The blocking insulating layers may include a high-k dielectric material. The high-k dielectric material refers to a dielectric material having a higher dielectric constant than an oxide.

Insulating regions 180 are formed between the semiconductor regions 130. The insulating regions 180 may be formed between adjacent memory cell strings, which use different semiconductor regions 130. The gate electrodes 160 of the adjacent memory cell strings may be connected to one another under the insulating regions 180. The insulating regions 180 may insulate first and second string selection transistors SST1 and SST2, which are adjacent to each other in the x-direction, from each other. The insulating regions 180 may be formed as air gaps. Because air has a lower dielectric constant than other insulating materials, capacitance between the first and second string selection transistors SST1 and SST2 of adjacent memory cell strings may be lowered.

In the non-volatile memory device 1000 having the 3-D structure according to the current embodiment, a plurality of memory cells may be formed at the same height and share a wordline to be electrically connected to one another around a cell array region. Thus, specific memory cells MC1 through MC4 may not be selected through selections of the bitlines BL1 through BLm and the wordlines WL1 through WLn of FIG. 1, but a specific memory cell string may be selected through first and second string selection transistors SST1 and SST2. Therefore, the first and second string selection transistors SST1 and SST2 may need to be formed separately from each other between adjacent memory cell strings and may need enhanced voltage transmission capacities. In the non-volatile memory device 1000 of the current embodiment, the insulating regions 180 are formed as air gaps between the adjacent first and second string selection transistors SST1 and SST2 and thus lower parasitic capacitances of string selection lines SSL (refer to FIGS. 1 and 2), thereby reducing or preventing RC delay of a signal.

FIGS. 4A through 4J are cross-sectional views illustrating a method of fabricating the non-volatile memory device 1000 of FIG. 3, according to an embodiment of the inventive concept. Here, the cross-sectional views are taken along the y-direction of the perspective view of FIG. 3.

Figure 4A:
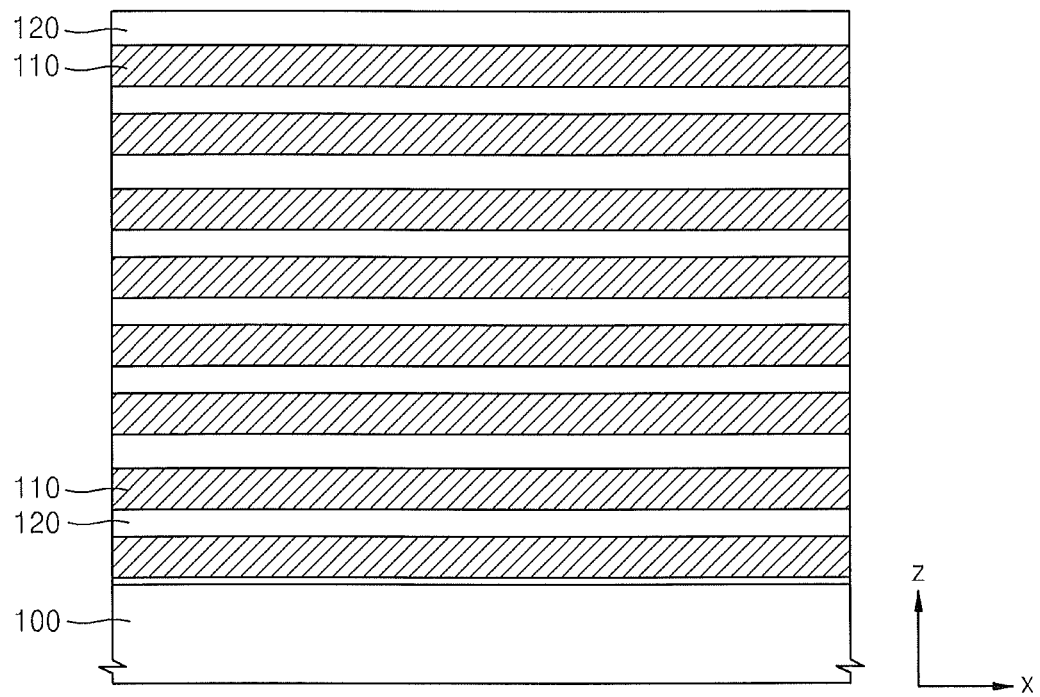

Referring to FIG. 4A, sacrificial layers 110 and the interlayer insulating layers 120 are alternately stacked on the substrate 100. As shown in FIG. 4A, the sacrificial layers 110 and the insulating layers 120 are alternately stacked on the substrate 100, starting from the insulating layers 120. The sacrificial layers 110 may be formed of a material which is etched by having etch selectivity with respect to the interlayer insulating layers 120. In other words, the sacrificial layers 110 may be formed of a material, which is etched while reducing or minimizing etching of the interlayer insulating layers 120 in an etching process. The etch selectivity may be quantitatively expressed in a ratio of an etching speed of the sacrificial layers 110 to an etching speed of the interlayer insulating layers 120. For example, the interlayer insulating layers 120 may be at least one of silicon oxide layers and silicon nitride layers, and the sacrificial layers 110 may be selected from silicon layers, silicon oxide layers, silicon carbide layers, and silicon nitride layers, which are different from the material for the interlayer insulating layers 120.

According to an aspect of the inventive concept, thicknesses of the interlayer insulating layers 120 may not be the same as shown in FIG. 4A. A lowermost one of the interlayer insulating layers 120 may be much thinner than the other interlayer insulating layers 120, and a lower third one and an upper third one of the interlayer insulating layers 120 may be thicker than the other interlayer insulating layers 120. However, the thicknesses and the number of interlayer insulating layers 120 and sacrificial layers 110 may be modified in accordance with various embodiments of the inventive concept.

Figure 4B:
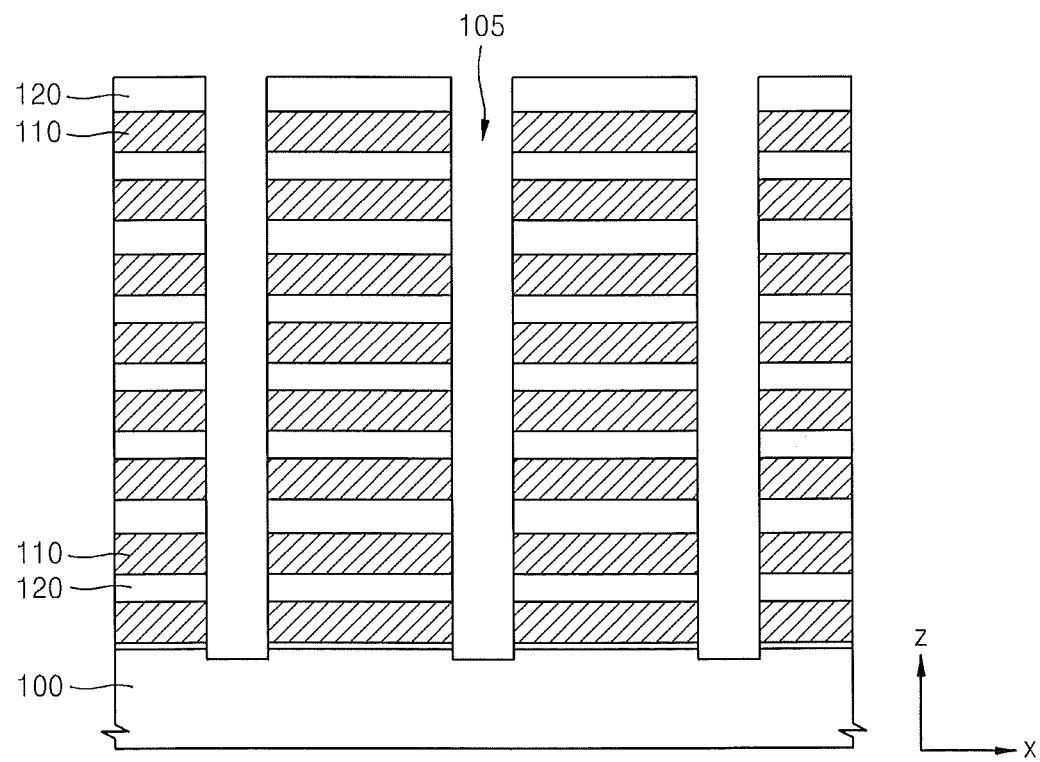

Referring to FIG. 4B. First openings 105 are formed in the interlayer insulating layers 120 and the sacrificial layers 110, which are alternately stacked. The first openings 105 may be holes having depths in a z-direction. The first openings 105 may also be isolation regions, which are spaced apart from one another in an x-direction and a y-direction (refer to FIG. 3).

A process of forming the first openings 105 includes: forming predetermined mask patterns, which define positions of the first openings 105, on the interlayer insulating layers 120 and the sacrificial layers 110, which are alternately stacked; and alternately anisotropically etching the interlayer insulating layers 120 and the sacrificial layers 110 using the predetermined mask patterns as etch masks. Because a structure having different types of layers is etched, sidewalls of the first openings 105 may not be completely vertical to an upper surface of the substrate 100. For example, as the sidewalls of the first openings 105 get close to the upper surface of the substrate 100, widths of the first openings 105 may be decreased.

The first openings 105 expose parts of the upper surface of the substrate 100 as shown in FIG. 4B. The first openings 105 may be over-etched in the anisotropic etching, thereby recessing parts of the substrate 100 underneath the first openings 105 to predetermined depths as shown in FIG. 4B.

Figure 4C:
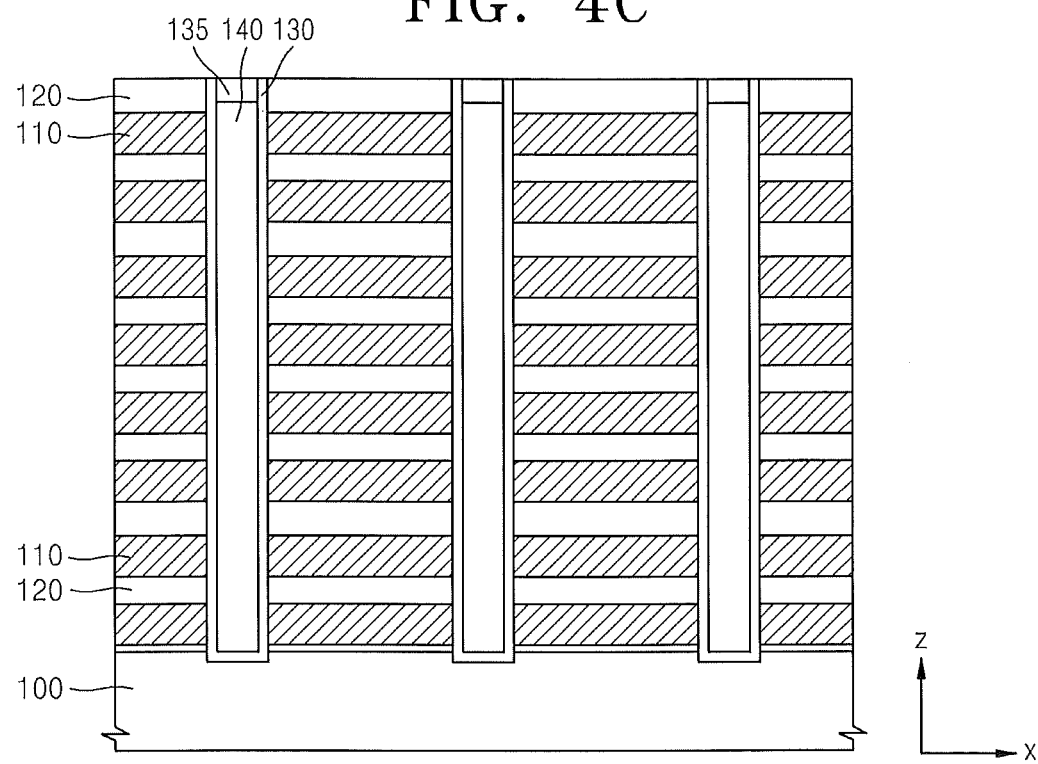

Referring to FIG. 4C, the semiconductor regions 130 are formed to uniformly cover sidewalls and lower surfaces of the first openings 105 of FIG. 4B.

The semiconductor regions 130 may be formed using atomic layer deposition (ALD) or chemical vapor deposition (CVD). Each of the semiconductor regions 130 may be formed to a uniform thickness, e.g., a thickness within a range between about 1/50 and 1/5 of a width of each of the first openings 105.

Internal parts (not shown) of the first openings 105 are filled with the insulating pillars 140. According to another aspect of the inventive concept, before the insulating pillars 140 are buried into the internal parts of the first openings 105, a hydrogen annealing process may be further performed to anneal a structure including the semiconductor regions 130 in a gas ambient condition including hydrogen or heavy hydrogen. Many parts of crystal defects existing in the semiconductor regions 130 may be cured by the hydrogen annealing process.

A planarization process, e.g., a chemical mechanical polishing (CMP) process or an etch-back process, is performed to remove unnecessary semiconductor and insulating materials covering the uppermost one of the interlayer insulating layers 120 until the uppermost one is exposed. Upper parts of the insulating pillars 140 are removed using an etching process or the like, and the conductive layers 135 are deposited on the upper parts of the insulating pillars 140 that have been removed. The planarization process may be re-performed to form the conductive layers 135, which are disposed on the insulating pillars 140 and connected to the semiconductor regions 130.

According to another aspect of the inventive concept, the semiconductor regions 130 may be formed filling the internal parts of the first openings 105 (refer to FIG. 4B). In this case, the process of forming the insulating pillars 140 may be omitted. Also, impurities may be injected into upper parts of the semiconductor regions 130, which fill all of the internal parts of the first openings 105, thereby forming the conductive layers 135.

Figure 4D:
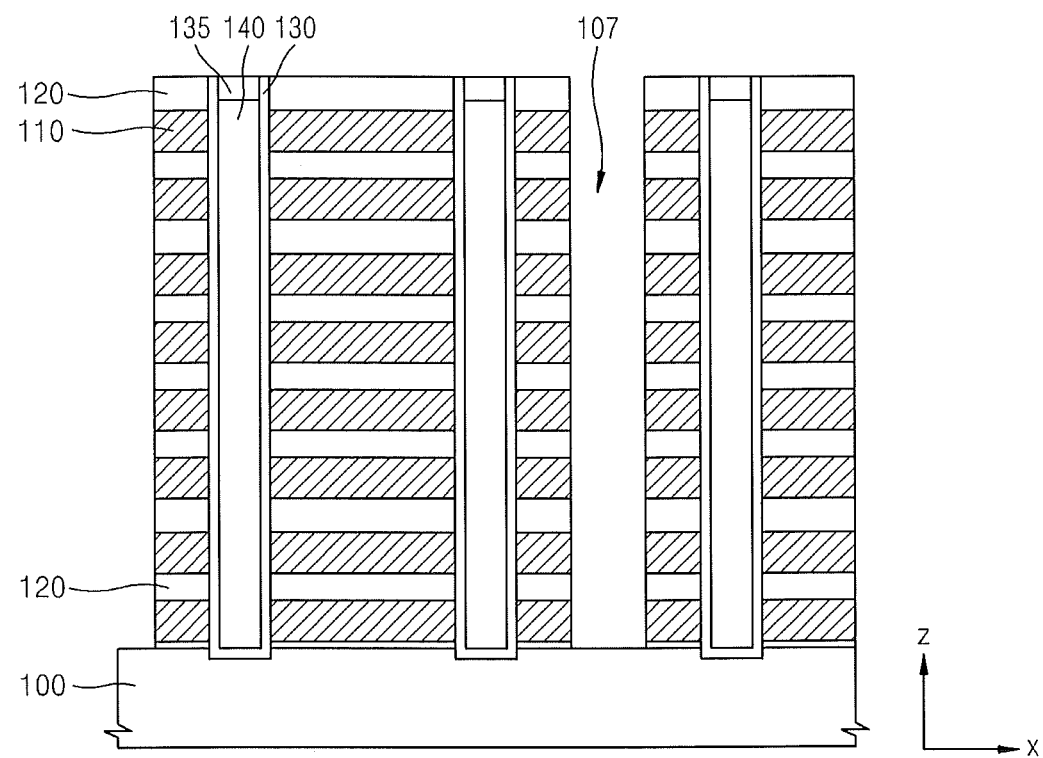

Referring to FIG. 4D, second openings 107 are formed and expose the substrate 100. The second openings 107 extend in the y-direction (refer to FIG. 3).

The process of forming the second openings 107 may include: forming etch masks which define the second openings 107; and alternately anisotropically etching the interlayer insulating layers 120 and the sacrificial layers 110 positioned underneath the etch masks until the upper surface of the substrate 100 is exposed.

According to another aspect of the inventive concept, the second openings 107 may be formed one-by-one for every two of the semiconductor regions 130 as shown in FIG. 4D, but are not limited thereto. Relative dispositions of the semiconductor regions 130 and the second openings 107 may vary.

Referring to FIG. 4E, the sacrificial layers 110 (refer to FIG. 4D), which are exposed through the second openings 107 are selectively removed. Due to the removal of the sacrificial layers 110, a plurality of tunnels 107T are formed among the interlayer insulating layers 120, are connected to the second openings 107, and expose parts of sidewalls of the semiconductor regions 130.

The process of forming the tunnels 107T may include horizontally etching the sacrificial layers 110 using an etch recipe having etch selectivity with respect to the interlayer insulating layers 120. For example, if the sacrificial layers 110 are silicon nitride layers and the interlayer insulating layers 120 are silicon oxide layers, the horizontal etching may be performed using an etchant including a phosphoric acid. The horizontal etching may be isotropic etching including wet-etching or chemical dry etching (CDE).

Referring to FIG. 4F, the gate dielectric layers 150 are formed to uniformly cover parts of the semiconductor regions 130, parts of the interlayer insulating layers 120, and parts of the substrate 100, which are exposed by the second openings 107 and the tunnels 107T of FIG. 4E.

The gate dielectric layers 150 include tunneling insulating layers 152, charge storage layers 154, and blocking insulating layers 156. Thus, the gate dielectric layers 150 are formed in the order of the tunneling insulating layers 152, the charge storage layers 154, and the blocking insulating layers 156 to cover the semiconductor regions 130, the interlayer insulating layers 120, and the substrate 100. The tunneling insulating layers 152, the charge storage layers 154, and the blocking insulating layers 156 may be formed using ALD or CVD.

The gate dielectric layers 150 are uniformly formed to predetermined thicknesses, thereby forming internal openings (not shown) in the second openings 107 and the tunnels 107T. The internal openings defined by the gate dielectric layers 150 are filled with a conductive material. After the conductive material is deposited, unnecessary parts of the conductive material in the internal openings are removed, thereby forming third openings 108.

Thus, inner parts of the tunnels 107T are filled with the conductive material to form the gate electrodes 160. The process of removing the unnecessary parts of the conductive material may be performed using anisotropic etching. Parts of the gate dielectric layers 150 formed on the upper surface of the substrate 100 are removed using anisotropic etching According to another aspect of the inventive concept, parts of the gate dielectric layers 150 formed on sides of the interlayer insulating layers 120 may be removed together.

Impurities are injected into the substrate 100 through the third openings 108 to form the impurity regions 102 which are adjacent to the upper surface of the substrate 100 and extend in the y-direction (refer to FIG. 3). The impurity regions 102 may be heavily-doped impurity regions, which are formed by injecting N+ type impurities. The process of forming the impurity regions 102 may not be performed in the current process but may be performed in a previous or subsequent process.

Figure 4G:
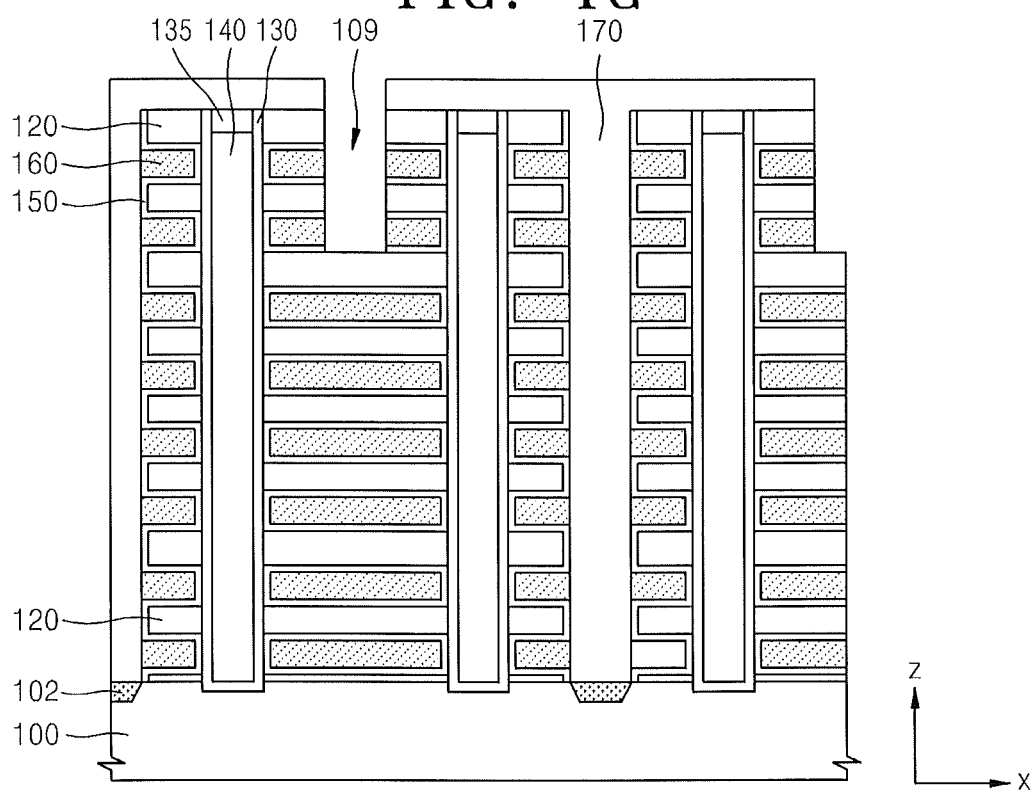

Referring to FIG. 4G, the insulating layers 170 fill the third openings 108 of FIG. 4F so as to be formed on the impurity regions 102. The insulating layers 170 are formed on the uppermost one of the interlayer insulating layers 120, the semiconductor regions 130, and the conductive layers 135.

Fourth openings 109 are formed among the semiconductor regions 130 and above parts of the substrate 100 on which the impurity regions 102 have not been formed. Thus, the fourth openings 109 may be formed one-by-one for every two of the semiconductor regions 130, like the third openings 108. The fourth openings 109 may have pillar shapes, which extend in the y-direction (refer to FIG. 3). The fourth openings 109 may be formed to lower ends of the second string selection transistors SST2 (refer to FIG. 3). According to another aspect of the inventive concept, the fourth openings 109 may extend on and contact the substrate 100.

Figure 4H:
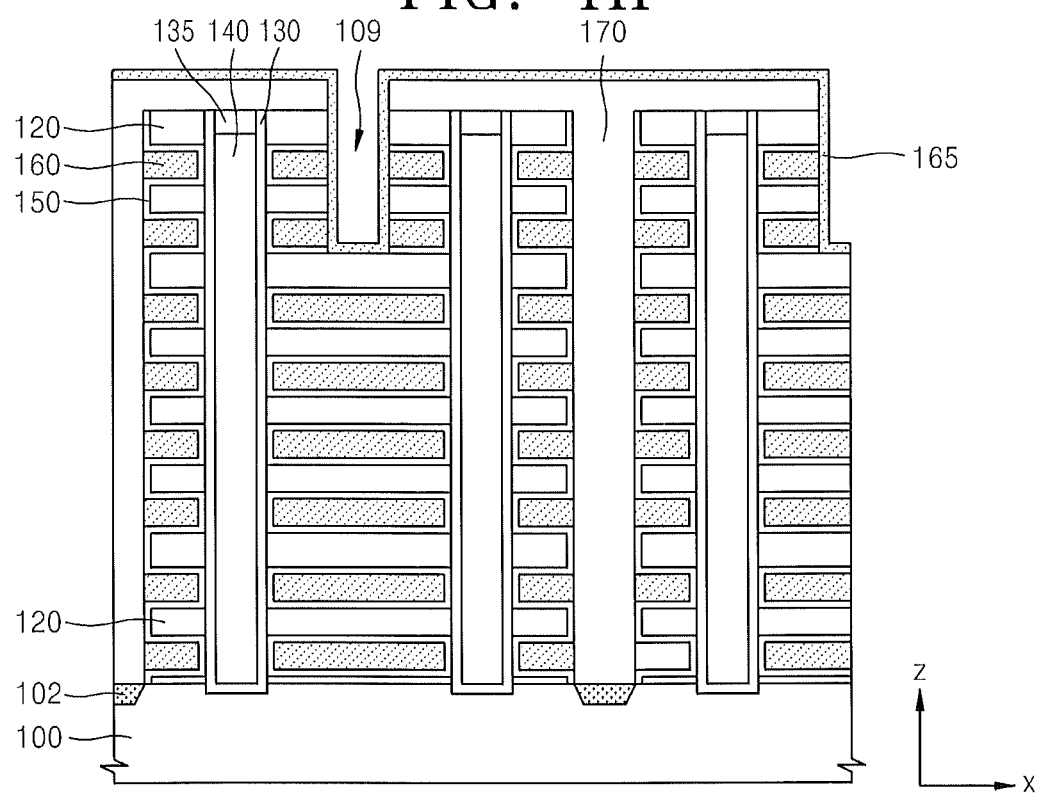

Referring to FIG. 4H, a material of which the connection electrodes 165 are to be formed is deposited on the insulating layers 170 and the fourth openings 109. The deposition process may be performed using CVD or ALD so that the material is uniformly deposited.

Figure 4I:
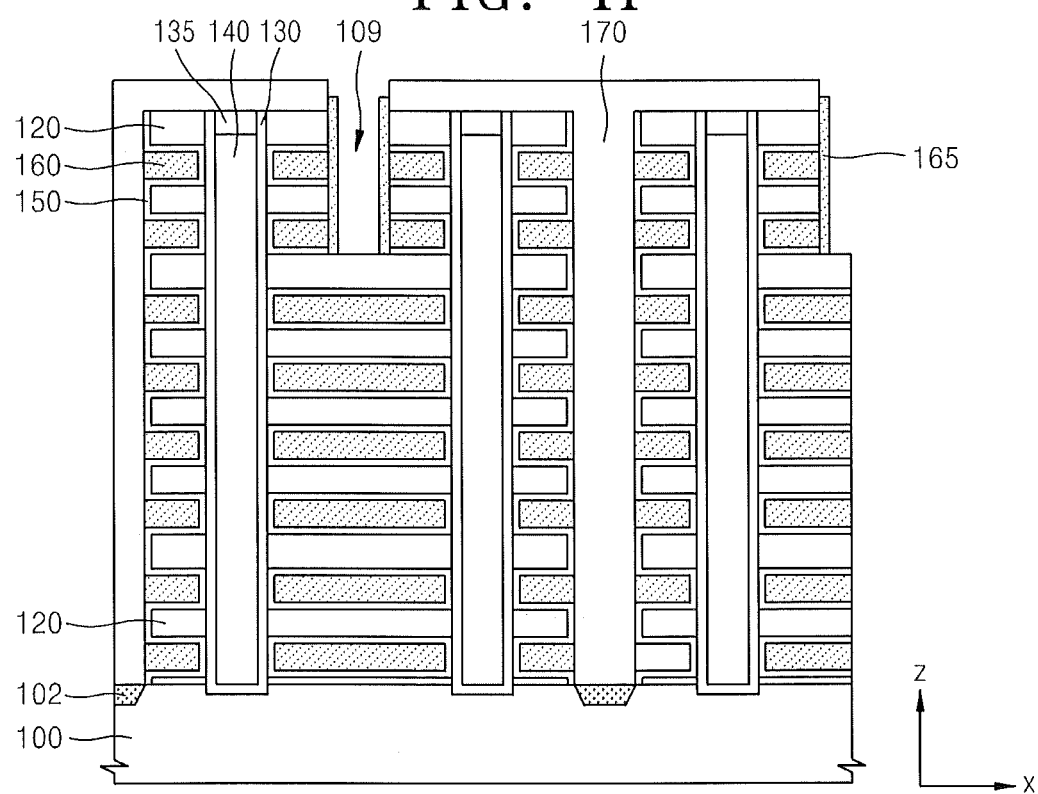

Referring to FIG. 4I, parts of the material for the connection electrodes 165 formed on the insulating layers 170 are removed. Parts of the material for the connection electrode 165 deposited at bottoms of the fourth openings 109 are also removed. The removing process may include a photolithograpy process and an etching process such as etch-back. As a result, the connection electrodes 165 are completed and connect the gate electrodes 160 of the first and second string selection transistors SST1 and SST2 to one another. Upper ends of the connection electrodes 165 positioned in a vertical direction (i.e., in the z-direction) may be higher than upper surfaces of the gate electrodes 160 of the first string selection transistors SST1.

Figure 4J:
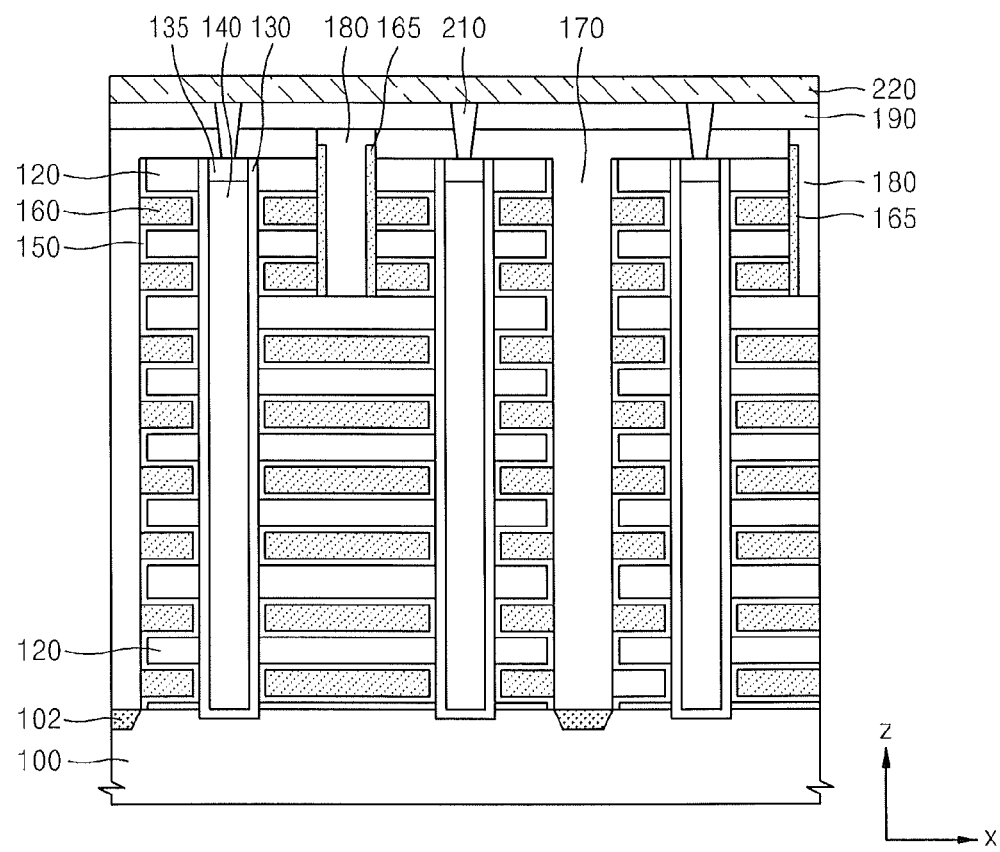

Referring to FIG. 4J, a capping layer 190 is formed on the insulating layers 170 and the fourth openings 109 of FIG. 4I. The capping layer 190 may include an insulating material.

The capping layer 190 may be formed using a material and a method by which gap-fill is not achieved well. If an insulating material is not conformally deposited, the insulating material may not be deposited into the fourth openings 109 but may cap upper parts of the fourth openings 109 due to a width of each of the fourth openings 109 between several tens of nanometers and hundreds of nanometers. Thus, the insulating regions 180 are formed in parts in which the fourth openings 109 have been formed. The insulating regions 180 are formed as air gaps. The insulating regions 180 are not limited to shapes in FIG. 4J, but central parts of upper ends of the insulating regions 180 contacting the capping layer 190 may be recessed to predetermined depths.

The insulating regions 180 are disposed between the first and second string selection transistors SST1 and SST of adjacent memory cell strings, thereby decreasing capacitance between the first and second string selection transistors SST1 and SST2 of adjacent memory cell string. The insulating regions 180 may contribute to an increase in a dielectric breakdown voltage between the first and second string selection transistors SST1 and SST2 of the adjacent memory cell strings.

Bitline contact plugs 210 are formed on the conductive layers 135 and penetrate the capping layer 190. The bitline contact plugs 210 may be formed using a photolithography process and an etching process. Bitlines 220 are formed on the capping layer 190 and connect the bitline contact plugs 210, which are arrayed in the x-direction, to one another. The bitlines 220 may also be formed in line shapes using a photolithography process and an etching process.

Figure 5:
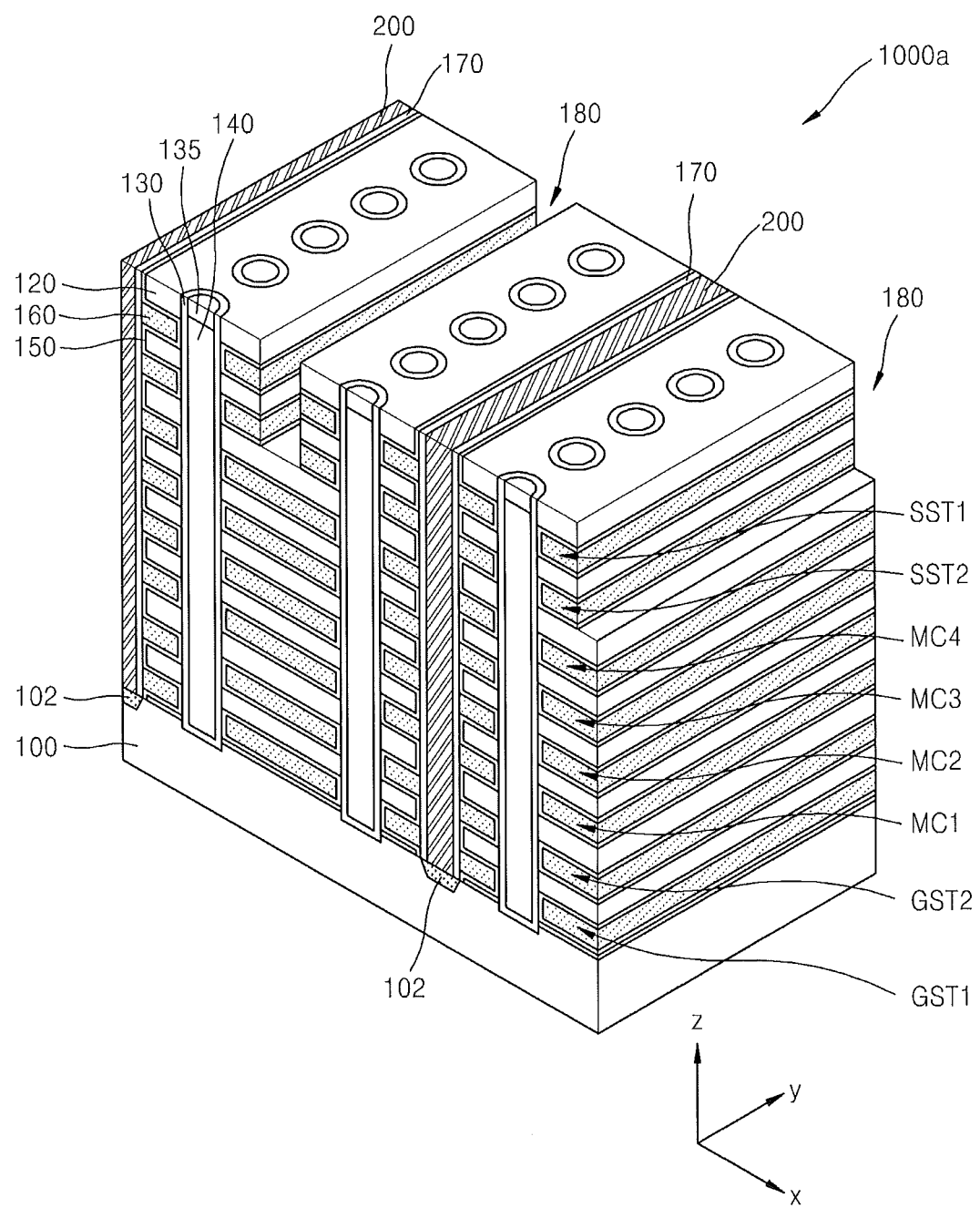
FIG. 5 is a schematic perspective view of a 3-D structure of memory cell strings of a non-volatile memory device according to another embodiment of the inventive concept.

FIG. 5 is a schematic perspective view of a 3-D structure of memory cell strings of a non-volatile memory device 1000a according to another embodiment of the inventive concept.

The same reference numerals of FIG. 5 as those of FIG. 3 denote like elements, and thus their detailed descriptions will be omitted herein. Referring to FIG. 5, common source lines (CSLs) 200 are arrayed on impurity regions 102 of the non-volatile memory device 1000a, extend in a z-direction on the impurity regions 102 of the non-volatile memory device 1000a, and come into ohmic contacts with the impurity regions 102. The CSLs 200 extend in a y-direction along the impurity regions 102. The non-volatile memory device 1000a does not include connection electrodes (165 of FIG. 3).

The CSLs 200 may include a conductive material. For example, the CSLs 200 may include at least one metal material selected from W, aluminum (Al), and copper (Cu). Although not shown in FIG. 5, silicide layers may be interposed between the impurity regions 102 and the CSLs 200 and may lower contact resistances between the impurity regions 102 and the CSLs 200. The silicide layers (not shown) may include metal silicide layers, e.g., cobalt silicide layers.

If the impurity regions 102 have an opposite conductive type from the substrate 100, the impurity regions 102 may be source regions of first and second ground selection transistors GST1 and GST2. According to an aspect of the inventive concept, if the impurity regions 102 have the same conductive type as the substrate 100, the CSLs 200 may operate as pocket P well contact electrodes necessary for erasing operations respectively performed in memory cell blocks. In this case, a high voltage may be applied to the substrate 100 through the pocket P well contact electrodes, thereby erasing data from all memory cells of a corresponding memory cell block of the substrate 100.

The CSLs 200 are insulated from the gate electrodes 160 with the insulating layers 170. The insulating layers 170 may have spacer shapes. By using the same process as that described with reference to FIG. 4G, an insulating material may be deposited, and then a photolithography process and an etching process such as etch-back may be additionally performed on areas in which the third openings 108 are formed as shown in FIG. 4F, thereby forming the insulating layers 170. A conductive material may be deposited, and then an etching process, such as etch-back may be additionally performed on the conductive material, thereby forming the CSLs 200. Insulating regions 180 may be formed using the same processes as those described with reference to FIGS. 4G and 4J.

The CSLs 200 may provide source regions to the first and second ground selection transistors GST1 and GST2 of memory cell strings beside the two semiconductor regions 130, which are adjacent to each other in the x-direction.

Figure 6:
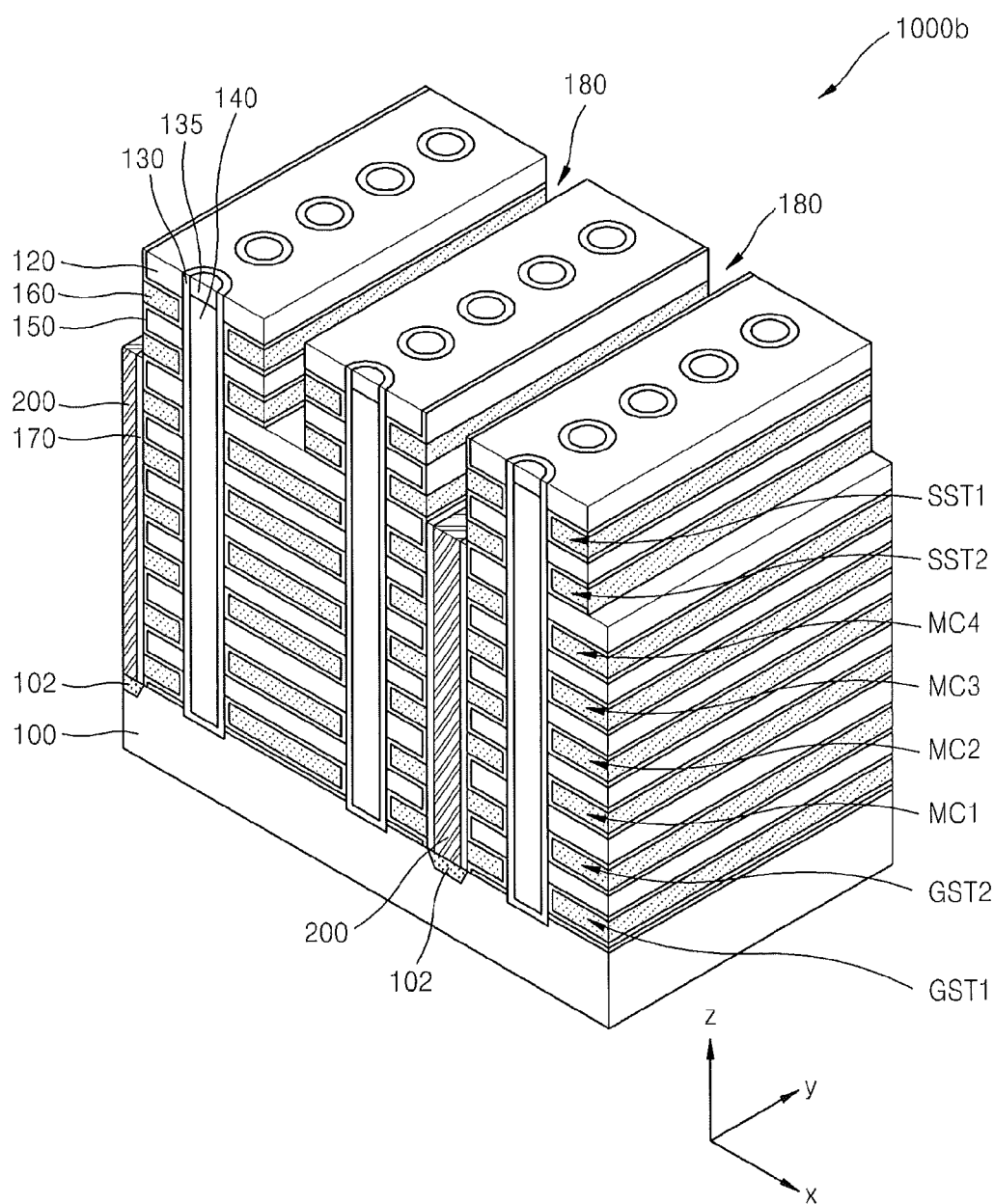
FIG. 6 is a schematic perspective view of a 3-D structure of memory cell strings of a non-volatile memory device according to another embodiment of the inventive concept.

FIG. 6 is a schematic perspective view of a 3-D structure of memory cell strings of a non-volatile memory device 1000*b* according to another embodiment of the inventive concept.

The same reference numerals of FIG. 6 as those of FIGS. 3 and 5 denote the same elements, and thus their detailed descriptions will be omitted herein. Referring to FIG. 6, CSLs 200 of the non-volatile memory device 1000*b* are formed on impurity regions 102 and extend in a z-direction to the same heights as lower ends of second string selection transistors SST2. The CSLs 200 come into ohmic contacts with the impurity regions 102. The CSLs 200 extend in a y-direction along the impurity regions 102. Insulating regions 180 are formed on the CSLs 200 and insulating layers 170 are disposed on sidewalls of the CSLs 200. The non-volatile memory device 1000*b* does not include connection electrodes (165 of FIG. 3).

In the non-volatile memory device 1000*b* having the above-described structure, the CSLs 200 are formed, and then fourth openings (109 of FIG. 4G) are formed among the semiconductor regions 130 according to the same processes as those described with reference to FIGS. 4G and 5. In other words, the fourth openings (109) may be formed one-by-one for each one of the semiconductor regions 130. The fourth openings (109) may be formed to the lower ends of second string selection transistors SST2 (refer to FIG. 3). The insulating regions 180 may be formed using the same process as that described with reference to FIG. 4J.

Thus, the insulating regions 180 are respectively formed between every two of the semiconductor regions 130. Each of the insulating regions 180 is formed between the adjacent first and second string selection transistors SST1 and SST2 which are adjacent to two semiconductor regions 130.

The insulating regions 180 are formed as air gaps. Since air has a lower dielectric constant than other insulating materials, and each of the insulating regions 180 is formed between every first and second string selection transistors SST1 and SST2 of adjacent memory cell strings, interference between the first and second string selection transistors SST1 and SST2 may be reduced or minimized.

Figure 7:
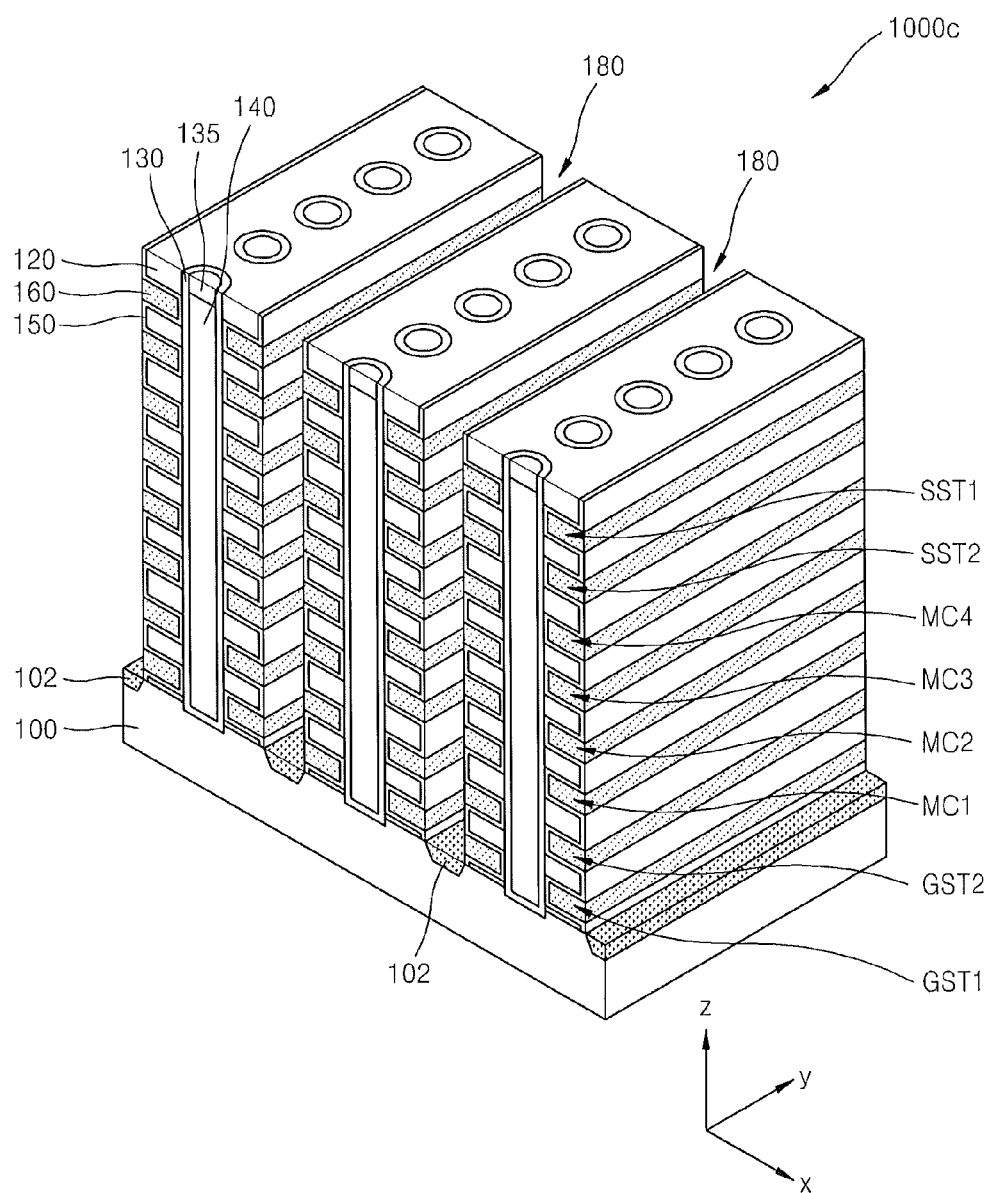
FIG. 7 is a schematic perspective view of a 3-D structure of memory cell strings of a non-volatile memory device according to another embodiment of the inventive concept.

FIG. 7 is a schematic perspective view of a 3-D structure of memory cell strings of a non-volatile memory device 1000*c* according to another embodiment of the inventive concept.

The same reference numerals of FIG. 7 as those of FIGS. 3, 5, and 6 denote the same elements, and thus their detailed descriptions will be omitted herein. Referring to FIG. 7, impurity regions 102 of the non-volatile memory device 1000*c* alternate with semiconductor regions 130 on a substrate 100. The impurity regions 102 extend in a y-direction along the substrate 100. Insulating regions 180 are formed on the impurity regions 102 and extend in a z-direction. The insulating regions 180 extend in the y-direction along the impurity regions 102. The non-volatile memory device 1000*c* does not include connection electrodes (165 of FIG. 3).

In the non-volatile memory device 1000*c* having the above-described structure, each of a plurality of third openings (108 of FIG. 4F) is formed between every two of the semiconductor regions 130 using the same process as that described with reference to FIG. 4F. Impurities are injected into the substrate 100 through the third openings (108), thereby forming the impurity regions 102. The insulating regions 180 may be formed using the same process as that described with reference to FIG. 4J.

The insulating regions 180 are formed as air gaps. Because air has a lower dielectric constant than other insulating materials, interferences between first and second string selection transistors SST1 and SST2 of adjacent memory cells, interferences between first and second ground selection transistors GST1 and GST2 of the adjacent memory cell strings, and interferences among the adjacent memory cells MC1, MC2, MC3, and MC4 may be reduced or minimized.

Figure 8:
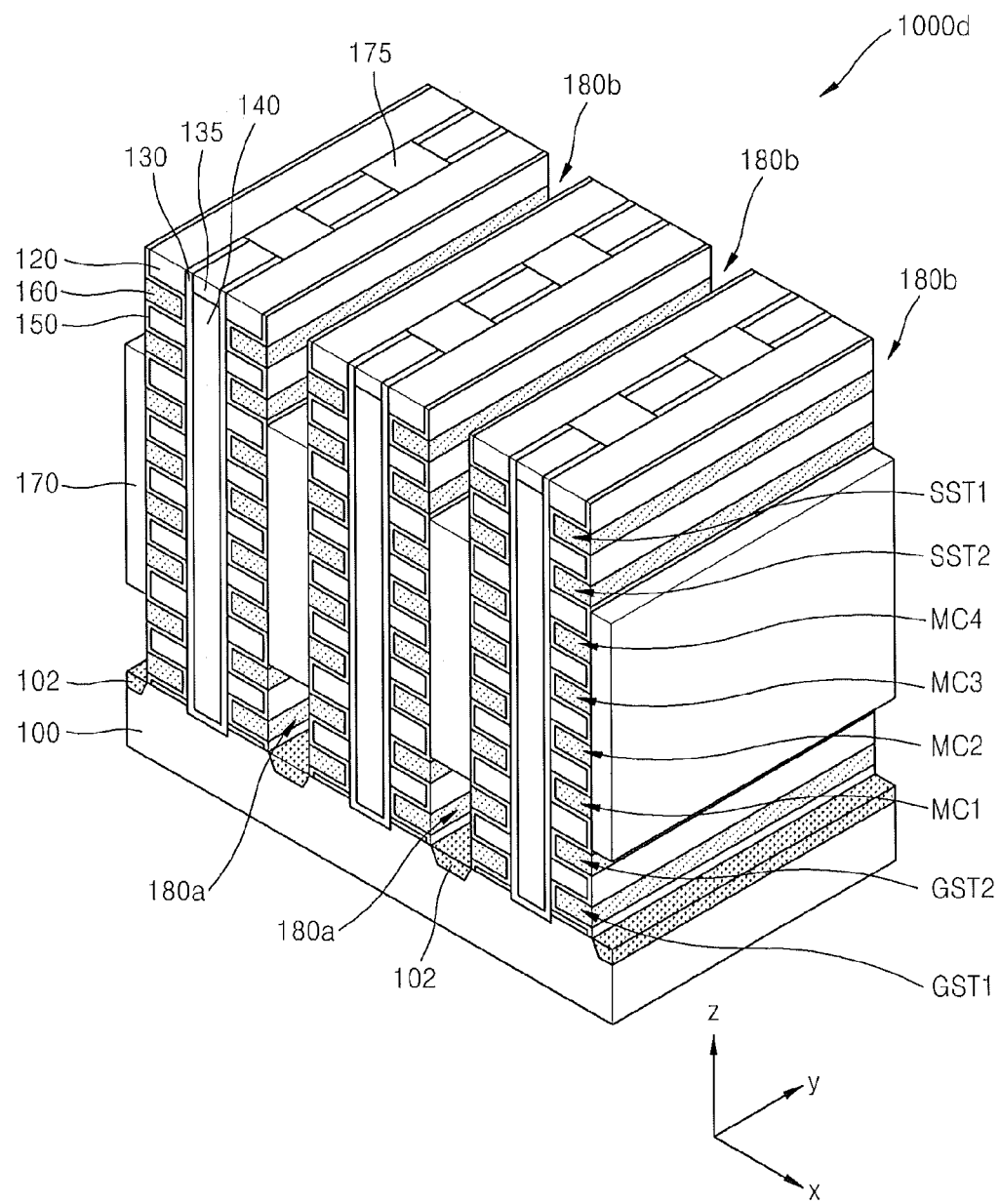
FIG. 8 is a schematic perspective view of a 3-D structure of memory cell strings of a non-volatile memory device according to another embodiment of the inventive concept.

FIG. 8 is a schematic perspective view of a 3-D structure of memory cell strings of a non-volatile memory device 1000*d* according to another embodiment of the inventive concept.

The same reference numerals of FIG. 8 as those of FIGS. 3 and 5 through 7 denote the same elements, and thus their detailed descriptions will be omitted herein. Referring to FIG. 8, impurity regions 102 of the non-volatile memory device 1000*d* alternate with semiconductor regions 130 on a substrate 100. Lower insulating regions 180*a* above the impurity regions 102 are spaced apart from upper insulating regions 180*b*. Insulating layers 170 are formed between the lower insulating regions 180*a* and the upper insulating regions 108*b*. The non-volatile memory device 1000*d* does not include connection electrodes (165 of FIG. 3).

In the non-volatile memory device 1000*d* having the above-described structure, each of a plurality of third openings (108 of FIG. 4F) is formed between every two of the semiconductor regions 130 using the same process as that described with reference to FIG. 4F. Impurities are injected to the substrate 100 through the third openings (108), thereby forming the impurity regions 102. The third openings (108) may be vertically formed in the z-direction on the substrate 100. An insulating material is deposited to form the insulating layers 170 using a similar process to that, of forming the capping layer 190 described with reference to FIG. 4J, thereby forming the lower insulating regions 180*a* as air gaps. A process of etching the insulating layers 170 is performed. The upper insulating regions 180*b* may also be formed using the similar process to that described with reference to FIG. 4J.

The lower and upper insulating regions 180*a* and 180*b* are formed as air gaps. Since air has a lower dielectric constant than other insulating materials, interferences between first and second string selection transistors SST1 and SST2 of adjacent memory cell strings and interferences between first and second ground selection transistors of GST1 and GST2 of the adjacent memory cell strings may be reduced or minimized.

In the current embodiment, the semiconductor regions 130 are disposed in pillar shapes and spaced apart from one another in the x-direction and y-direction. Thus, two memory cell strings may extend and be arrayed in the z-direction along both sides of one of the semiconductor regions 130 positioned in the x-direction. Insulating layers 175 are arrayed among the semiconductor regions 130 arrayed in the y-direction and insulate the semiconductor regions 130 from one another.

Figure 9:
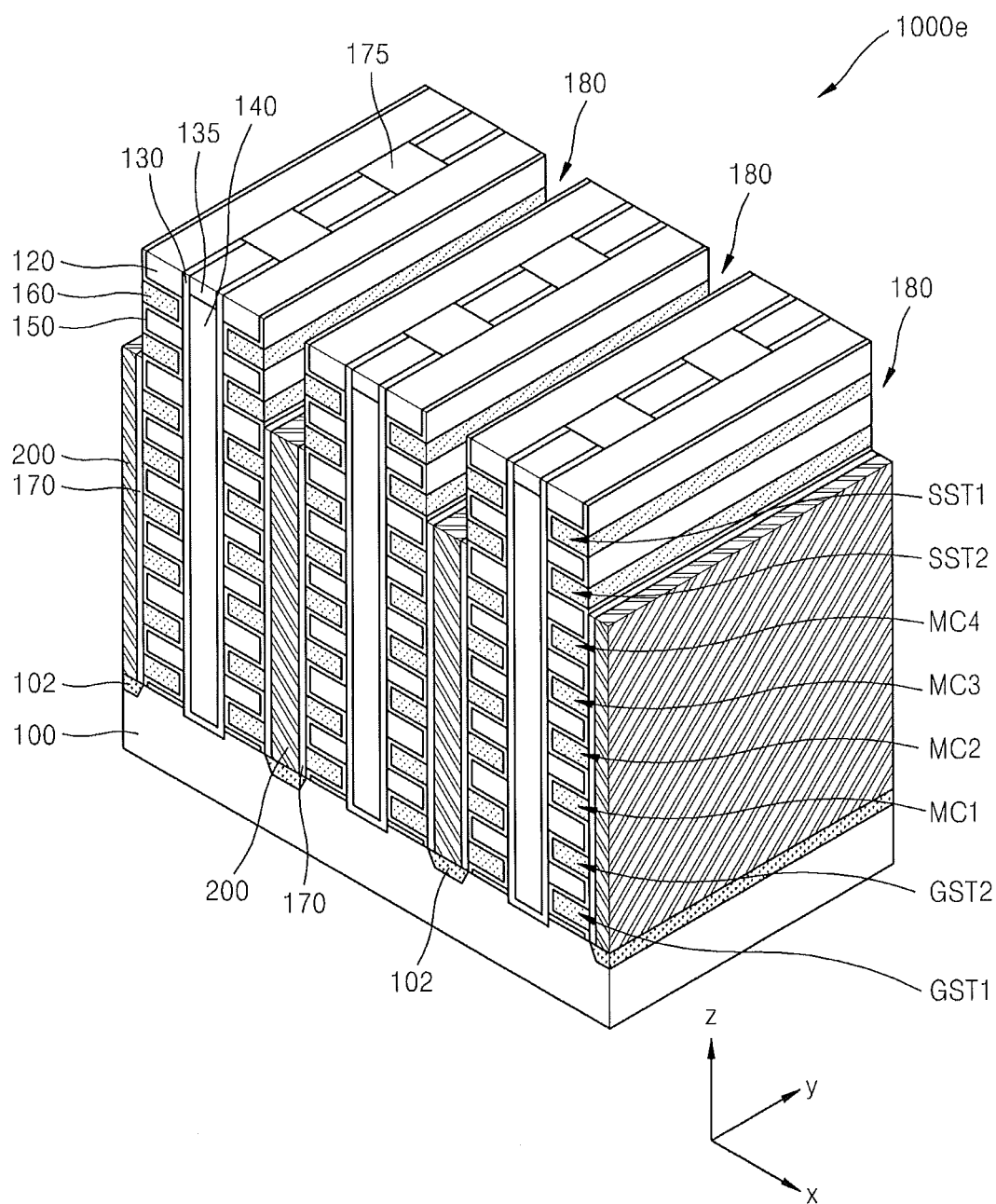
FIG. 9 is a schematic perspective view of a 3-D structure of memory cell strings of a non-volatile memory device according to another embodiment of the inventive concept.

FIG. 9 is a schematic perspective view of a 3-D structure of memory cell strings of a non-volatile memory device 1000*e* according to another embodiment of the inventive concept.

The same reference numerals of FIG. 9 as those of FIGS. 3 and 5 through 8 denote the same elements, and thus their detailed descriptions will be omitted herein. Referring to FIG. 9, impurity regions 102 of the non-volatile memory device 1000*e* alternate with semiconductor regions 130 on a substrate 100. The non-volatile memory device 1000*e* does not include connection electrodes (165 of FIG. 3).

CSLs 200 extend in a z-direction on the impurity regions 102 to lower ends of second string selection transistors SST2. The CSLs 200 come into ohmic contact with the impurity regions 102. The CSLs 200 extend in a y-direction along the impurity regions 102. Insulating regions 180 are formed on the CSLs 200 and insulating layers 170 are formed on sidewalls of the CSLs 200.

In the non-volatile memory device 1000*e* having the above-described structure, the CSLs 200 are formed, and then fourth openings (109 of FIG. 4G) are each formed between every two of the semiconductor regions 130 using the same process as that described with reference to FIGS. 4G and 6. In other words, the fourth openings (109) may be formed alternately with the semiconductor regions 130. The fourth openings (109) may be formed to lower ends of the second string selection transistors SST2 (refer to FIG. 3). The insulating regions 180 may be formed using the same process as that described with reference to FIG. 4J.

Figure 10:
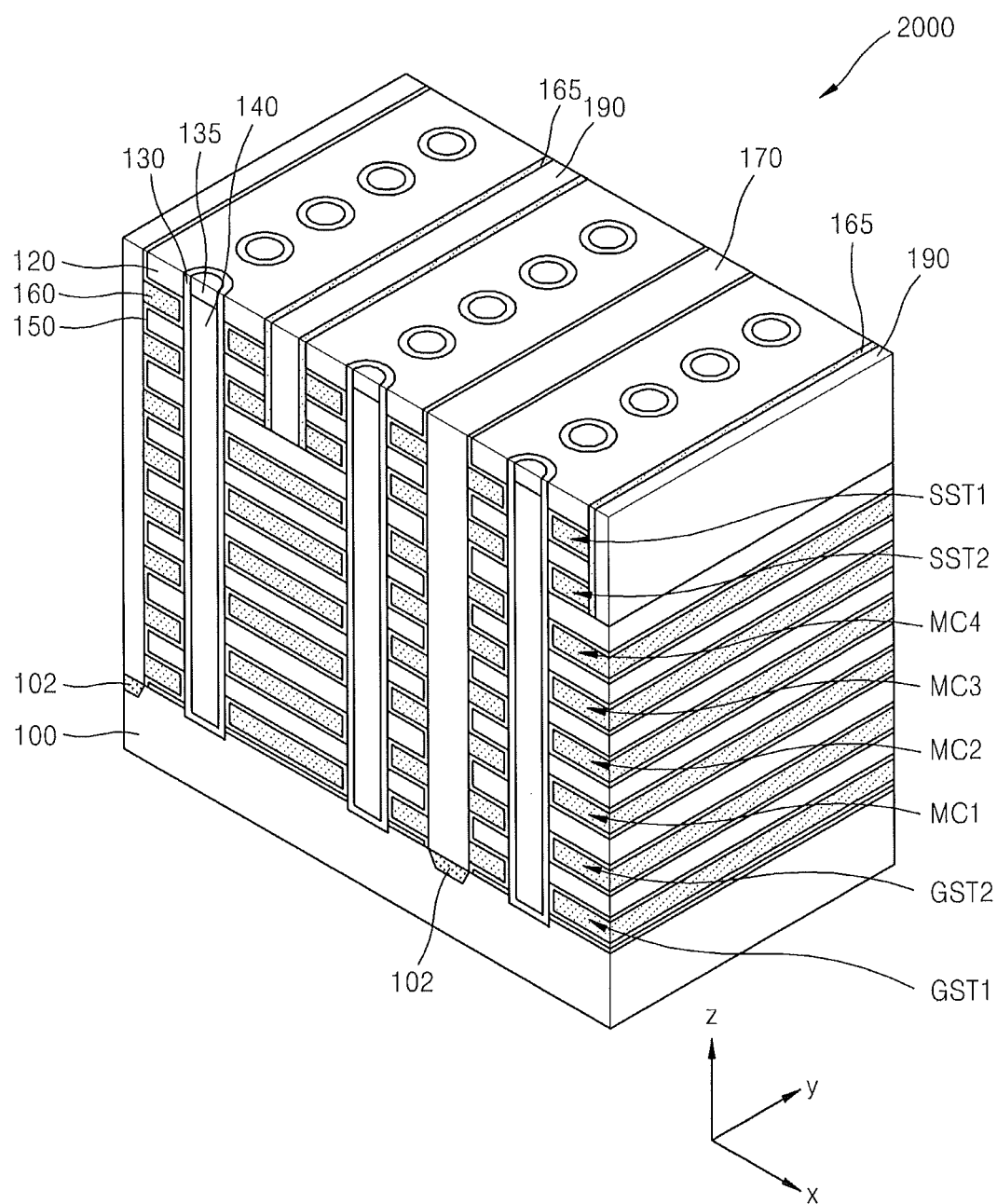
FIG. 10 is a schematic perspective view of a 3-D structure of memory cell strings of a non-volatile memory device according to another embodiment of the inventive concept.

FIG. 10 is a schematic perspective view of a 3-D structure of memory cell strings of a non-volatile memory device 2000, according to another embodiment of the inventive concept.

The same reference numerals of FIG. 10 as those of FIGS. 3 and 5 through 9 denote the same elements, and thus their detailed descriptions will be omitted herein. Referring to FIG. 10, in the non-volatile memory device 2000, gate electrodes 160 of a pair of first and second string selection transistors SST1 and SST2 are connected to each other through connection electrodes 165. The connection electrodes 165 may include the same material as that included in the gate electrodes 160. For example, the connection electrodes 165 may include W, WN, or TiN. The non-volatile memory device 2000 does not include insulating regions (180 of FIG. 3).

According to the current embodiment, first and second ground selection transistors GST1 and GST2 may have the same structures as the first and second string selection transistors SST1 and SST2 for easiness of processes. A pair of first and second ground selection transistors GST1 and GST2 may be connected to each other in series and the pair of first and second string selection transistors SST1 and SST2 may be connected to each other in series, thereby enhancing a leakage current control capacity. In this case, the gate electrodes 160 of the first and second string selection transistors SST1 and SST2 are electrically connected to one another through the connection electrodes 165. Thus, a string selection line (SSL of FIGS. 1 and 2) is connected to the first and second string selection transistors SST1 and SST2 and thus extends from a cell array region to a peripheral region. As a result, a resistance of the string selection line (SSL) may be reduced, thereby lowering RC delay of a signal.

Figure 11:
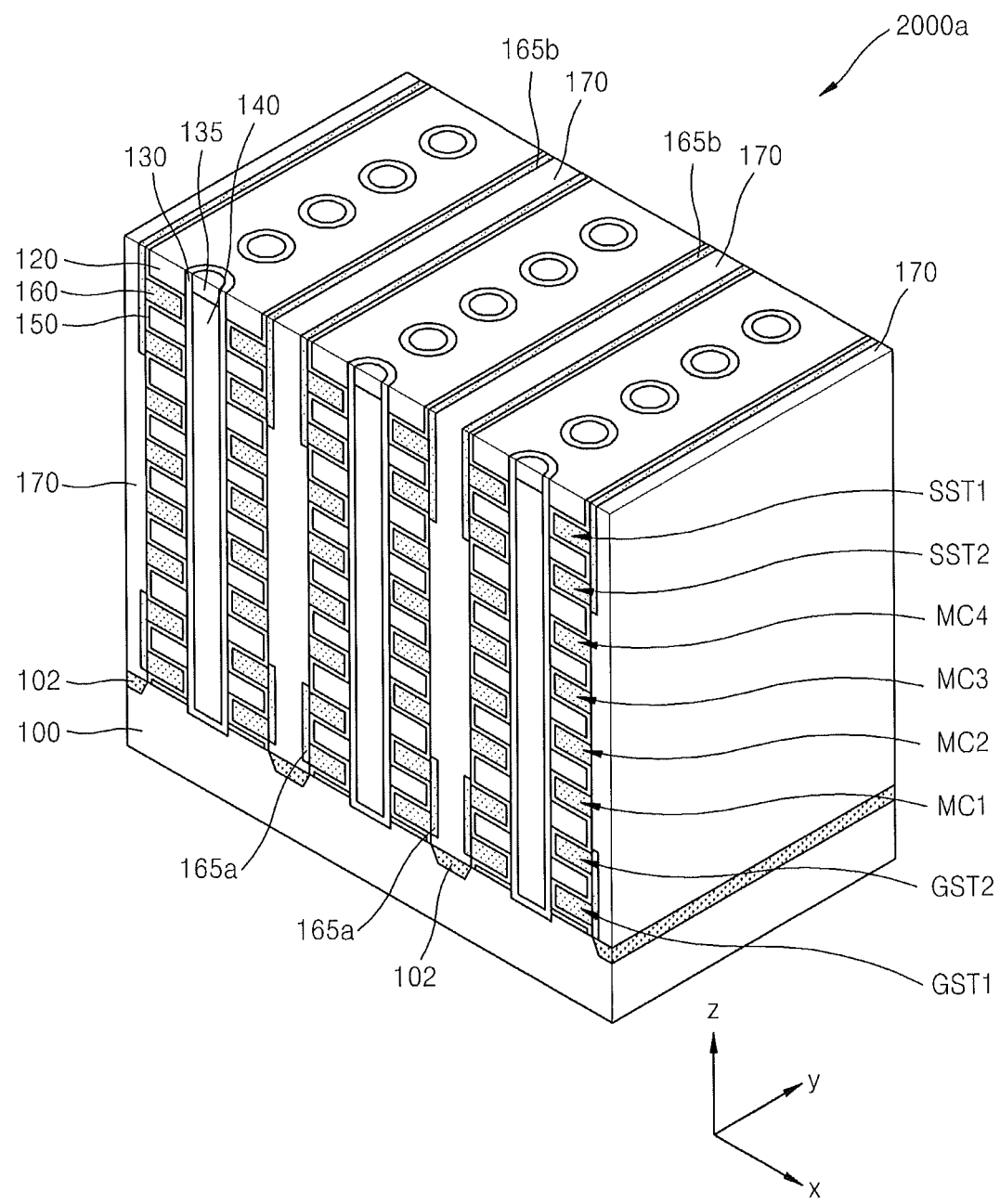
FIG. 11 is a schematic perspective view of a 3-D structure of memory cell strings of a non-volatile memory device according to another embodiment of the inventive concept.

FIG. 11 is a schematic perspective view of a 3-D structure of memory cell strings of a non-volatile memory device 2000a according to another embodiment of the inventive concept.

The same reference numerals of FIG. 11 as those of FIGS. 3 and 5 through 10 denote the same elements, and thus their detailed descriptions will be omitted herein. Referring to FIG. 11, gate electrodes 160 of a pair of first and second string selection transistors SST1 and SST2 of the non-volatile memory device 2000a are connected to one another through upper connection electrodes 165b. Also, gate electrodes 160 of a pair of first and second ground selection transistors GST1 and GST2 of the non-volatile memory device 2000a are connected to one another through lower connection electrodes 165a. The lower and upper connection electrodes 165a and 165b may include the same material as that included in the gate electrodes 160. For example, the lower and upper connection electrodes 165a and 165b may include W, WN, or TiN. Lower ends of the lower connection electrodes 165a positioned in a vertical direction (i.e., in the z-direction) may be spaced apart from impurity regions 102 of the substrate 100. The non-volatile memory device 2000a does not include insulating regions (180 of FIG. 3).

In the non-volatile memory device 2000a having the above-described structure, third openings (108 of FIG. 4F) are each formed between every two of semiconductor regions 130 using the same process as that described with reference to FIG. 4F. A material for the lower connection electrodes 165a is deposited into the third openings (108) and etched back, thereby forming the lower connection electrodes 165a. By using the same processes as those described with reference to FIGS. 4G through 4I, insulating layers 170 are formed, fourth openings (109 of FIG. 4G) are formed, and a material for the upper connection electrodes 165b is deposited and etched, thereby forming the upper connection electrodes 165b.

According to the current embodiment, the gate electrodes 160 of the first and second string selection transistors SST1 and SST2 are electrically connected to one another through the upper connection electrodes 165b. Also, the gate electrodes 160 of the first and second ground selection transistors GST1 and GST2 are electrically connected to one another through the lower connection electrodes 165a. Thus, a string selection line (SSL of FIGS. 1 and 2) and a ground selection line (GSL of FIGS. 1 and 2) may be connected to each other. Therefore, resistances of the string selection line (SSL) and the ground selection line (GSL) may be decreased, thereby lowering RC delay of a signal.

Figure 12A:
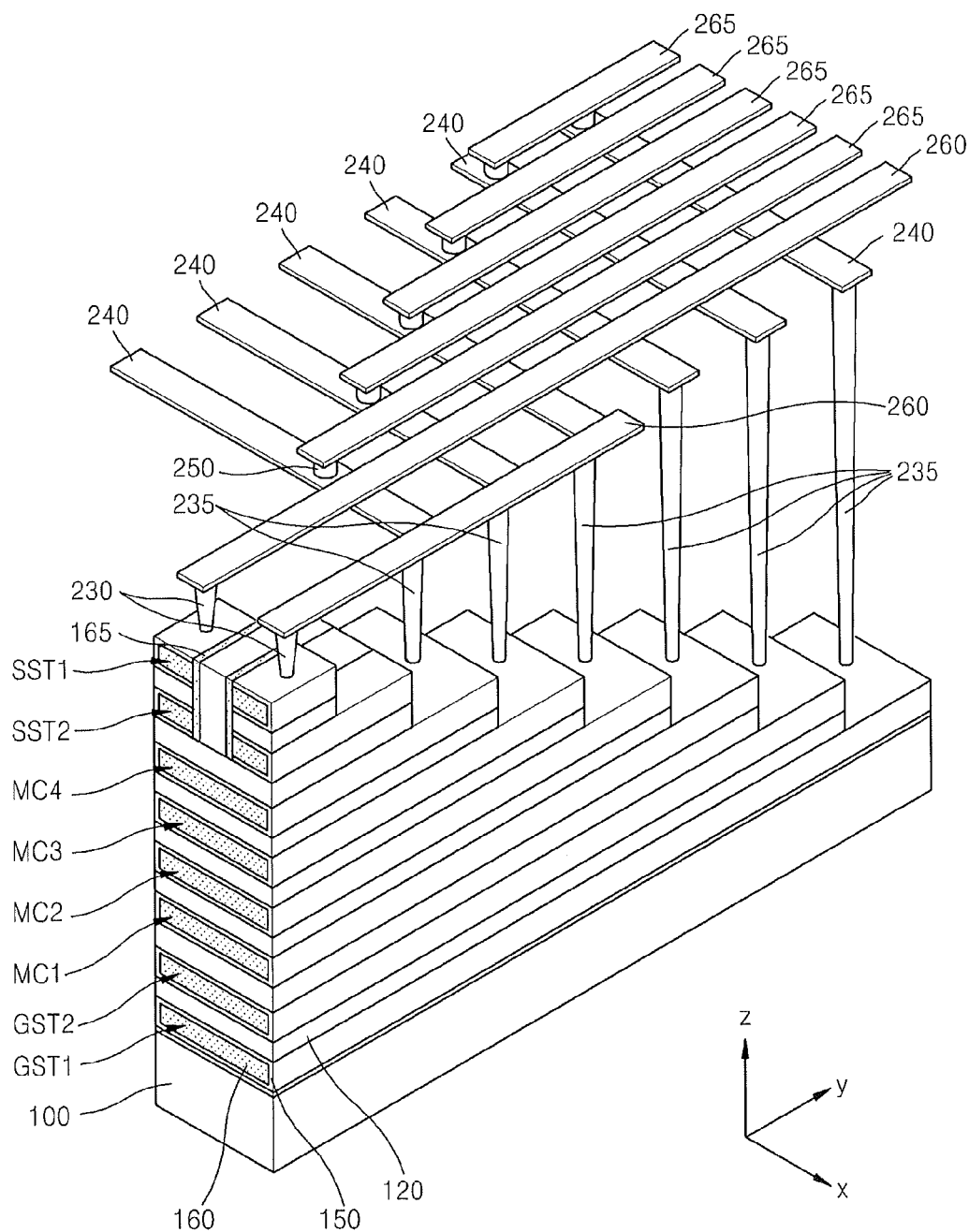
FIGS. 12A and 12B are respectively schematic perspective views illustrating connection regions disposed toward wordlines of the non-volatile memory devices of FIGS. 10 and 11.
Figure 12B:
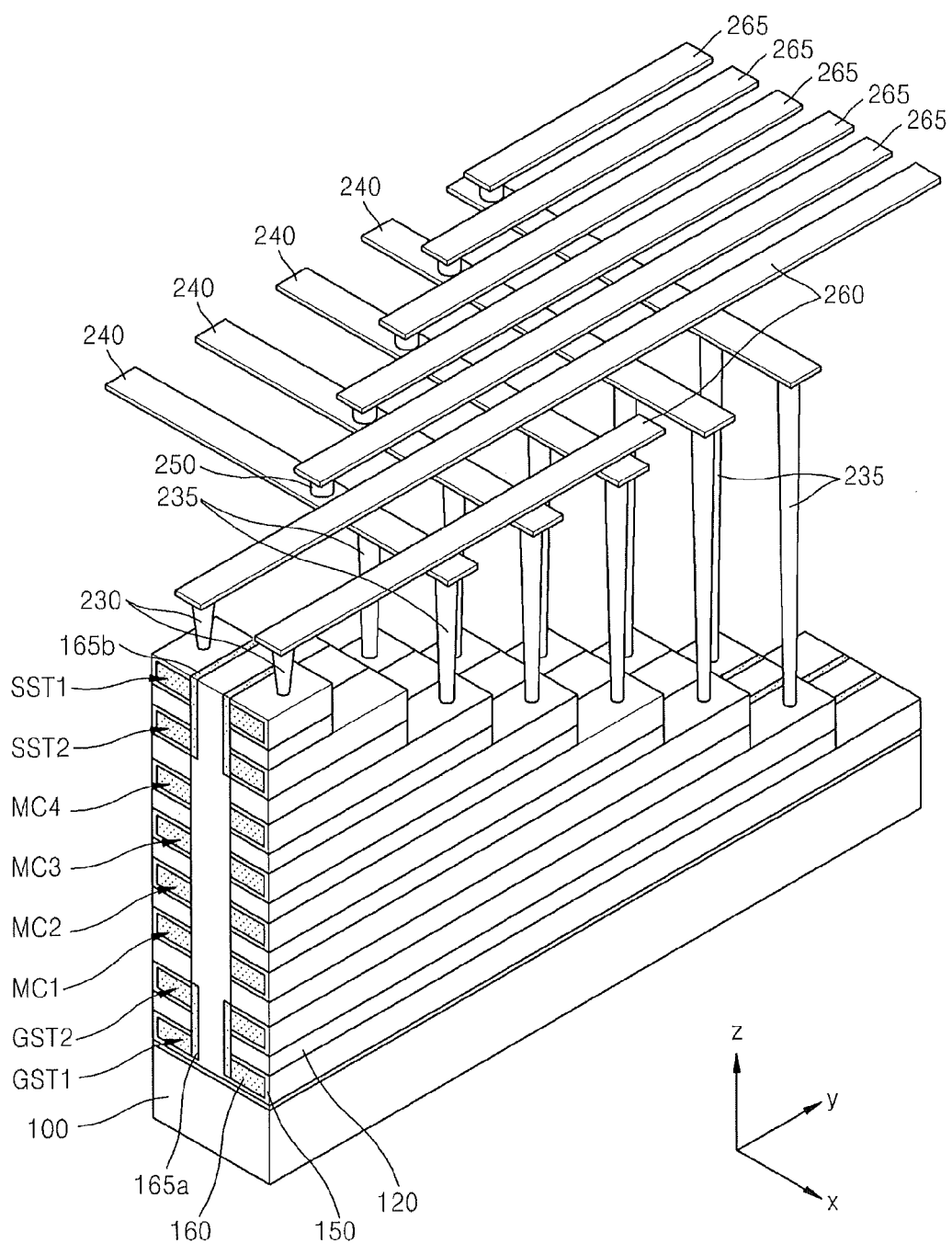

FIGS. 12A and 12B are respectively schematic perspective views illustrating connection regions positioned toward wordlines of the non-volatile memory devices 2000 and 2000a of FIGS. 10 and 11.

The connection regions are positioned around a y-direction of a cell array region and disposed between the cell array region and a decoding circuit region. In the connection regions, the wordlines are electrically connected to the decoding circuit region through wiring lines.

Referring to FIG. 12A, the gate electrodes 160 of the first and second string selection transistors SST1 and SST2 are connected to wiring lines 260 through contact plugs 230. Gate electrodes 160 of memory cells MC1, MC2, MC3, and MC4 and the first and second ground selection transistors GST1 and GST2 are connected to wordline sharing parts 240 through contact plugs 235. The wordline sharing parts 240 are connected to wiring lines 265 through vias 250. The contact plugs 230 and 235 are connected to the gate electrodes 160 through gate dielectric layers 150. An insulating material may be filled between the wiring lines 260 and 265 and the contact plugs 230 and 235.

The gate electrodes 160 of the first and second string selection transistors SST1 and SST2 of one memory cell string are electrically connected to one another through connection electrodes 165. Thus, a pair of first and second string selection transistors SST1 and SST2 may be connected to the wiring line 260 through one contact plug 230. As a result, the number of contact plugs 230 may be reduced, and thus contact and wiring processes may be simplified, and reliability of the non-volatile memory device 2000 may also be improved.

Each of the first and second string selection transistors SST1 and SST2 are connected to wiring lines 260 through the contact plugs 230 in each memory cell string. Thus, each of the memory cell strings may be selected.

The gate electrodes 160 of the first and second ground selection transistors GST1 and GST2 are not electrically connected to each other. Thus, a pair of first and second ground selection transistors GST1 and GST2 may be commonly connected to the wiring line 265 through two contact plugs 235, the wordline sharing parts 240, and the vias 250.

The gate electrodes 160 of the memory cells MC1, MC2, MC3, and MC4 are connected to the wordline sharing parts 240 through the contact plugs 235. Although not shown in FIG. 12A, the contact plugs 235 for wordlines of a plurality of adjacent memory cell strings may be electrically connected to one another through the wordline sharing parts 240.

According to an aspect of the inventive concept, the wiring lines 260 of the first and second string selection transistors SST1 and SST2 may be opposite to the wiring lines 265 of the memory cells MC1, MC2, MC3, and MC4. In other words, the wiring lines 260 may be formed facing connection regions which are opposite to the wiring lines 265.

Referring to FIG. 12B, the gate electrodes 160 of first and second string selection transistors SST1 and SST2 are connected to wiring lines 260 through contact plugs 230.

The gate electrodes 160 of the memory cells MC1, MC2, MC3, and MC4 and first and second ground selection transistors GST1 and GST2 are connected to wordline sharing parts 240 through contact plugs 235. The wordline sharing parts 240 are connected to wiring lines 265 through vias 250.

In the current embodiment, the gate electrodes 160 of the first and second string selection transistors SST1 and SST2 are electrically connected to one another through the upper connection electrodes 165b. Thus, each of the gate electrodes 160 may be connected to the wiring lines 260 through one contact plug 230. As a result, the number of contact plugs 230 may be reduced.

In the current embodiment, the gate electrodes 160 of the first and second ground selection transistors GST1 and GST2 are electrically connected to one another through the lower connection electrodes 165a. The contact plugs 235, which are connected to the gate electrodes 160 of the first and second ground selection transistors GST1 and GST2 of adjacent memory cell strings, may be connected to one wiring line 265.

Figure 13:
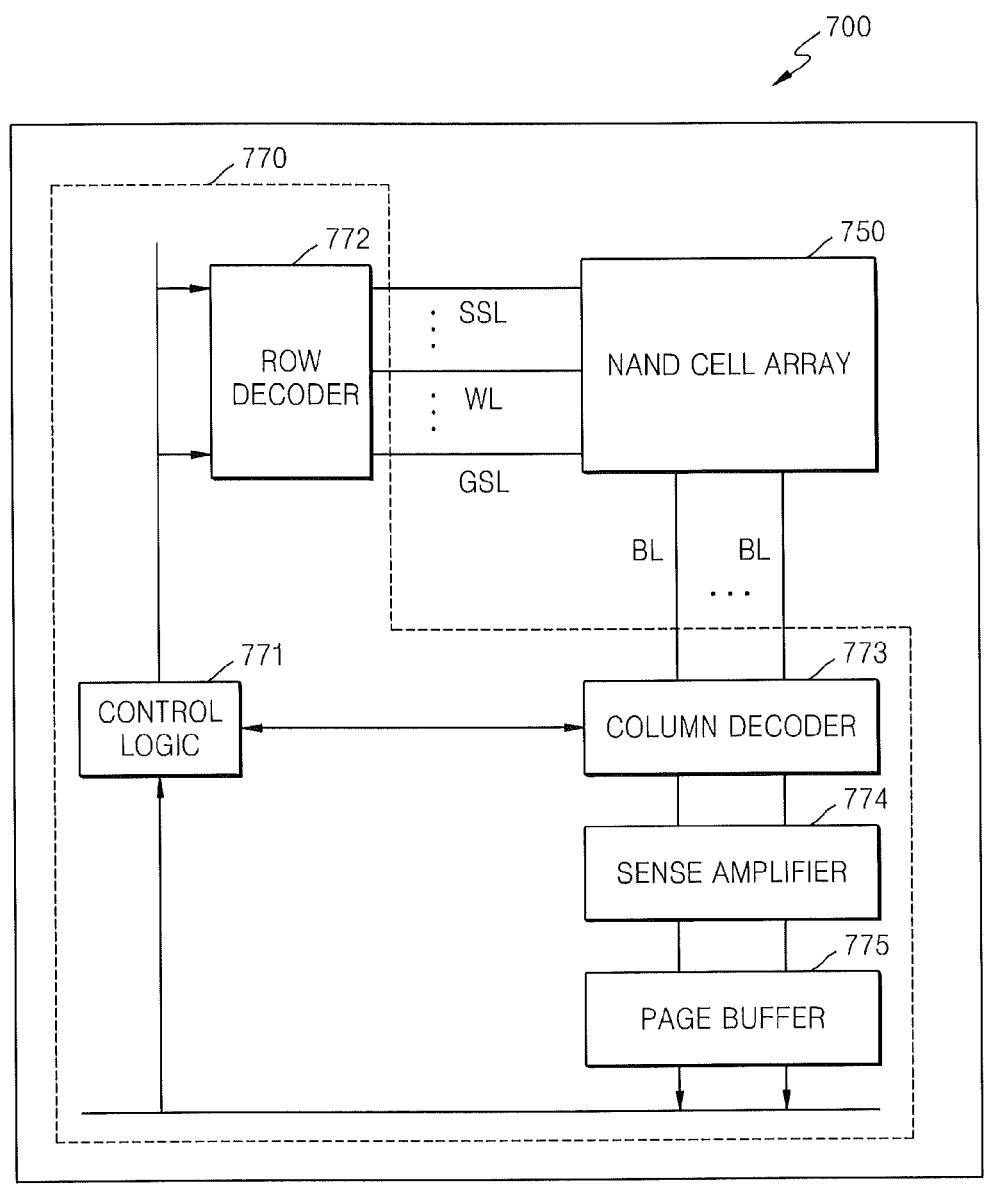
FIG. 13 is a schematic block diagram of a non-volatile memory device according to another embodiment of the inventive concept.

FIG. 13 is a schematic block diagram of a non-volatile memory device 700 according to another embodiment of the inventive concept.

Referring to FIG. 13, the non-volatile memory device 700 includes a NAND cell array 750 and a core circuit unit 770 which are connected to each other. For example, the NAND cell array 750 may be included in one of the non-volatile memory devices 1000, 1000a, 1000b, 1000c, 1000d, 1000e, 2000, and 2000a described with reference to FIGS. 3 and 5 through 11. The core circuit unit 770 includes a control logic 771, a row decoder 772, a column decoder 773, a sense amplifier 774, and a page buffer 775.

The control logic 771 communicates with the row decoder 772, the column decoder 773, and the page buffer 775. The row decoder 772 communicates with the NAND cell array 750 through a plurality of string selection lines SSL, a plurality of wordlines WL, and a plurality of ground selection lines GSL. The column decoder 773 communicates with the NAND cell array 750 through a plurality of bitlines BL. When the NAND cell array 750 outputs a signal, the sense amplifier 774 is connected to the column decoder 773. When the NAND cell array 750 receives a signal, the sense amplifier 774 is not connected to the column decoder 773.

For example, the control logic 771 may transmit a row address signal to the row decoder 772, and the row decoder 772 may decode the row address signal and transmit the row address signal to the NAND cell array 750 through the string selection lines SSL, the wordlines WL, and the ground selection lines GSL. The control logic 771 transmits a column address signal to the column decoder 773 or the page buffer 775, and the column decoder 773 decodes the column address signal and transmits the column address signal to the NAND cell array 750 through the bitlines BL. The signal output from the NAND cell array 750 is transmitted to the sense amplifier 774, and the sense amplifier 774 amplifies the signal and transmits the amplified signal to the control logic 771 through the page buffer 775.

Figure 14:
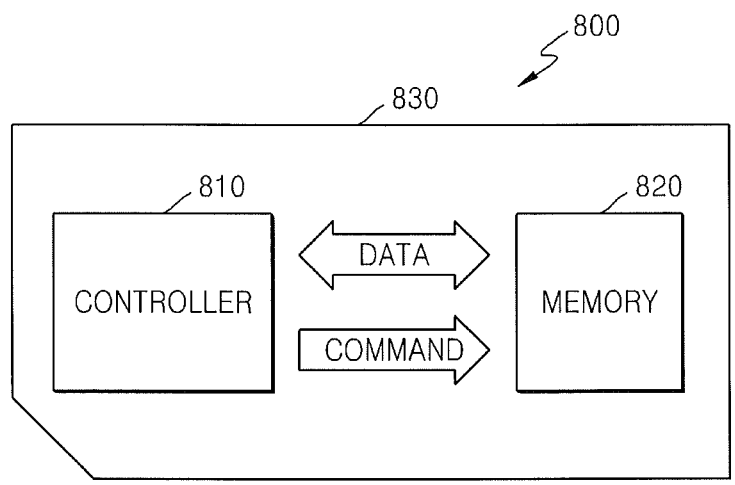
FIG. 14 is a schematic block diagram of a memory card according to an embodiment of the inventive concept.

FIG. 14 is a schematic block diagram of a memory card 800 according to an embodiment of the inventive concept.

Referring to FIG. 14, the memory card 800 includes a housing 830 which includes a controller 810 and a memory 820. The controller 810 and the memory 820 exchange an electrical signal with each other. For example, the memory 820 and the controller 810 exchange data with each other according to a command of the controller 810. Thus, the memory card 800 may store data in the memory 820 or output the data from the memory 820 to the outside.

For example, the memory 820 may include one of the non-volatile memory devices 1000, 1000a, 1000b, 1000c, 1000d, 1000e, 2000, and 2000a described with reference to FIGS. 3 and 5 through 11. The memory card 800 may be used as a data storage medium of various types of portable devices. For example, the memory card 800 may include a multimedia card (MMC) or a secure digital card (SDC).

Figure 15:
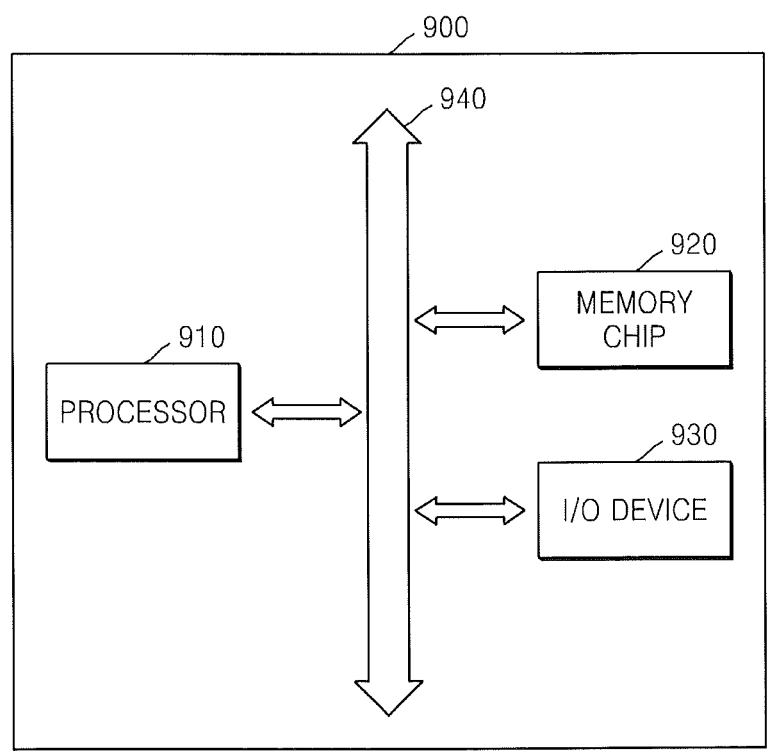
FIG. 15 is a block diagram of an electronic system according to an embodiment of the inventive concept.

FIG. 15 is a block diagram of an electronic system 900 according to an embodiment of the inventive concept.

Referring to FIG. 15, the electronic system 900 includes a processor 910, and input and/or output (I/O) unit 930, and a memory chip 920 which communicate data with one another through a bus 940. The processor 910 executes programs and controls the electronic system 900. The I/O unit 930 is used to input data into and/or output data from the electronic system 900. The electronic system 900 may be connected to an external device, e.g., a personal computer or a network, through the I/O unit 930 and thus may exchange data with an external device. The memory chip 920 stores codes and data for an operation of the processor 910. For example, the memory chip 920 may include one of the non-volatile memory devices 1000, 1000a, 1000b, 1000c, 1000d, 1000e, 2000, and 2000a described with reference to FIGS. 3 and 5 through 11.

The electronic system 900 may constitute various types of electronic control devices using the memory chip 920, e.g., may be used in a mobile phone, an MP3 player, a navigation system, a solid state disk (SSD), household appliances, or the like.

While the inventive concept has been particularly shown and described with reference to exemplary embodiments thereof, it will be understood that various changes in form and details may be made therein without departing from the spirit and scope of the following claims.

That which is claimed:

1. A vertical structure non-volatile memory device comprising:
    semiconductor regions vertically extending on a substrate;
    a first memory cell string vertically extending on the substrate and comprising a plurality of first memory cells and at least one first selection transistor, the plurality of first memory cells including a first gate electrode;
    a second memory cell string vertically extending on the substrate and comprising a plurality of second memory cells and at least one second selection transistor, the plurality of second memory cells including a second gate electrode connected to the first gate electrode;
    an interlayer insulating material on top surfaces of the at least one first selection transistor and the at least one second selection transistor;
    a first connection electrode that covers a sidewall of the at least one first selection transistor and a sidewall of the interlayer insulating material;
    a second connection electrode covers a sidewall of the at least one second selection transistor and another sidewall of the interlayer insulating material;
    bitlines connected to ends of the first and second memory cell strings;
    a first air gap between the at least one first selection transistor and the at least one second selection transistor and being separated from the substrate by the first gate electrode and the second gate electrode; and a length and a height of the first or second connection electrodes, and a distance between the first and second connection electrodes define a shape of the first air gap, wherein the first air gap extends in a direction crossing longitudinal directions of the bitlines, the first memory cell string, and the second memory cell string.

2. The vertical structure non-volatile memory device of claim 1, further comprising:
a second air gap spaced apart from the first air gap with at least a part of the semiconductor regions therebetween.

3. The vertical structure non-volatile memory device of claim 1, further comprising:
common source lines that are connected to other ends of the first and second memory cell strings in an opposite direction to the bitlines.

4. The vertical structure non-volatile memory device of claim 3, wherein the common source lines are vertically disposed on the substrate between the first and second memory cell strings.

5. The vertical structure non-volatile memory device of claim 4, wherein upper ends of the common source lines are lower than lower ends of the at least one first and at least one second selection transistors.

6. The vertical structure non-volatile memory device of claim 3, wherein the at least one first selection transistor is disposed between the bitlines and the plurality of first memory cells, and
wherein the at least one second selection transistor is disposed between the bitlines and the plurality of second memory cells.

7. The vertical structure non-volatile memory device of claim 1, wherein the first memory cell string further comprises at least one third selection transistor disposed between the substrate and the first memory cells, and
wherein the second memory cell string further comprises at least one fourth selection transistor disposed between the substrate and the second memory cells.

8. The vertical structure non-volatile memory device of claim 7, further comprising:
a lower air gap between the at least one third selection transistor and the at least one fourth selection transistor.

9. The vertical structure non-volatile memory device of claim 1, wherein the first and second memory cells, the at least one first selection transistor, and the at least one second selection transistor comprise gate dielectric layers and gate electrodes that are formed on sidewalls of the semiconductor regions.

10. The vertical structure non-volatile memory device of claim 9, wherein the gate dielectric layers comprise tunneling insulating layers, charge storage layers, and block insulating layers that are sequentially stacked from the semiconductor regions.

11. A vertical structure non-volatile memory device comprising:
a plurality of semiconductor regions vertically extending on a substrate;
memory cell strings vertically extending on the substrate, each of the memory cell strings comprising a plurality of memory cells and at least one pair of first selection transistors;
a plurality of connection electrodes, vertically extending on the substrate, each connected to at least one of the pairs of first selection transistors such that gate electrodes of the at least one pair of first selection transistors in a same one of the memory cell strings are connected to each other;
a first selection line commonly connected to the gate electrodes of the at least one pair of first selection transistors through a first connection electrode among the plurality of connection electrodes; and
a plurality of air gaps between adjacent ones of the memory cell strings, wherein a width of at least one of the plurality of air gaps is defined by the plurality of connection electrodes,
wherein a height of the at least one air gap is higher than a height of any of the plurality of the connection electrodes, and
wherein upper ends of the plurality of connection electrodes protrude above interlayer insulating layers adjacent the gate electrodes.

12. The vertical structure non-volatile memory device of claim 11, wherein the first selection line is wired to a peripheral circuit through one contact plug.

13. The vertical structure non-volatile memory device of claim 11, wherein upper ends of the connection electrodes protrude higher than upper ends of the at least one pair of first selection transistors.

14. The vertical structure non-volatile memory device of claim 11, wherein the memory cell strings further comprise at least one pair of second selection transistors disposed between the substrate and the plurality of memory cells.

15. The vertical structure non-volatile memory device of claim 14, further comprising a second selection line commonly connected to gate electrodes of the at least one pair of second selection transistors through a second connection electrode among the plurality of connection electrodes.

16. The vertical structure non-volatile memory device of claim 11, wherein the plurality of connection electrodes include the same material as that included in the gate electrodes of the at least one pair of first selection transistors.

17. A vertical structure non-volatile memory device comprising:
semiconductor regions vertically extending on a substrate;
a first memory cell string vertically extending on the substrate and comprising a plurality of first memory cells and at least one first selection transistor, the plurality of first memory cells including a first gate electrode;
a second memory cell string vertically extending on the substrate and comprising a plurality of second memory cells and at least one second selection transistor, the plurality of second memory cells including a second gate electrode connected to the first gate electrode;
an interlayer insulating material on top surfaces of the at least one first selection transistor and the at least one second selection transistor;
a first connection electrode that covers a sidewall of the at least one first selection transistor and a sidewall of the interlayer insulating material;
a second connection electrode covers a sidewall of the at least one second selection transistor and another sidewall of the interlayer insulating material;
bitlines connected to ends of the first and second memory cell strings;
a first air gap between the at least one first selection transistor and the at least one second selection transistor and being spaced apart from the substrate by a distance greater than a height of at least one of the first gate electrode and the second gate electrode; and a length and a height of the first or second connection electrodes, and a distance between the first and second connection electrodes define a shape of the first air gap, wherein the first air gap extends in a direction crossing longitudinal directions of the bitlines, the first memory cell string, and the second memory cell string.

* * * * *